United States Patent
Evans et al.

(10) Patent No.: US 12,300,463 B2
(45) Date of Patent: May 13, 2025

(54) METHOD AND SYSTEM FOR AUTOMATED FREQUENCY TUNING OF RADIOFREQUENCY (RF) SIGNAL GENERATOR FOR MULTI-LEVEL RF POWER PULSING

(71) Applicant: Lam Research Corporation, Fremont, CA (US)

(72) Inventors: Mathew Evans, Ontario (CA); Ying Wu, Livermore, CA (US); Alexander Paterson, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 744 days.

(21) Appl. No.: 17/607,301

(22) PCT Filed: May 9, 2020

(86) PCT No.: PCT/US2020/032271
§ 371 (c)(1),
(2) Date: Oct. 28, 2021

(87) PCT Pub. No.: WO2020/231881
PCT Pub. Date: Nov. 19, 2020

(65) Prior Publication Data
US 2022/0189738 A1    Jun. 16, 2022

Related U.S. Application Data

(60) Provisional application No. 62/846,586, filed on May 10, 2019.

(51) Int. Cl.
*H01J 37/32* (2006.01)
(52) U.S. Cl.
CPC .. *H01J 37/32146* (2013.01); *H01J 37/32155* (2013.01); *H01J 37/32183* (2013.01); *H01J 37/32926* (2013.01)

(58) Field of Classification Search
USPC ..................................... 156/345.48
See application file for complete search history.

(56) References Cited

U.S. PATENT DOCUMENTS

| | | | | |
|---|---|---|---|---|
| 5,667,701 A | * | 9/1997 | Sato ...................... | B24B 37/013 216/61 |
| 5,865,896 A | * | 2/1999 | Nowak ............... | H01J 37/3244 204/298.34 |

(Continued)

FOREIGN PATENT DOCUMENTS

WO    2010002488 A1    1/2010

OTHER PUBLICATIONS

International Search Report and Written Opinion of the International Searching Authority, PCT/US2020/032271.

*Primary Examiner* — Ram N Kackar
(74) *Attorney, Agent, or Firm* — Penilla IP, APC

(57) ABSTRACT

A two-dimensional frequency search grid is defined by a first coordinate axis representing an operating frequency setpoint of an RF signal generator in a first operational state and a second coordinate axis representing an operating frequency setpoint of the RF signal generator in a second operational state. The RF signal generator has a first output power level in the first operational state and a second output power level in the second operational state. The RF signal generator operates in an multi-level RF power pulsing mode by cyclically alternating between the first operational state and the second operational state. An automated search process is performed within the two-dimensional frequency search grid to simultaneously determine an optimum value for the operating frequency setpoint of the RF signal generator in the first operational state and an optimum value for the operating frequency setpoint of the RF signal generator in the second operational state.

19 Claims, 18 Drawing Sheets

(56) References Cited

U.S. PATENT DOCUMENTS

| | | |
|---|---|---|
| 2014/0290576 A1 | 10/2014 | Chen et al. |
| 2015/0130354 A1* | 5/2015 | Leray ................ H01J 37/32165 |
| | | 315/111.21 |
| 2017/0103873 A1 | 4/2017 | Kawasaki |
| 2017/0229288 A1 | 8/2017 | Mueller et al. |
| 2019/0066979 A1* | 2/2019 | Shoeb ................... H01J 37/321 |
| 2020/0381214 A1* | 12/2020 | Leray ................. H01L 21/3065 |

* cited by examiner

METHOD AND SYSTEM FOR AUTOMATED FREQUENCY TUNING OF RADIOFREQUENCY (RF) SIGNAL GENERATOR FOR MULTI-LEVEL RF POWER PULSING

This application is a national stage filing of and claims priority, under 35 U.S.C. § 371, to PCT/US2020/032271, filed on May 9, 2020, which claims the benefit of U.S. Provisional Application No. 62/846,586, filed on May 10, 2019. The entire disclosure of each application referenced above is incorporated herein by reference.

BACKGROUND

1. Field of the Disclosure

The present disclosure relates to semiconductor device fabrication.

2. Description of the Related Art

In the fabrication of semiconductor devices such as integrated circuits, memory cells, and the like, a series of manufacturing operations are performed to define features on a semiconductor wafer ("wafers" hereafter). The wafer includes integrated circuit devices in the form of multi-level structures defined on a silicon substrate. At a substrate level, transistor devices with diffusion regions are formed. In subsequent levels, interconnect metallization lines are patterned and electrically connected to the transistor devices to define a desired integrated circuit device. Also, patterned conductive layers are insulated from other conductive layers by dielectric materials.

Many modern semiconductor chip fabrication processes include generation of a plasma from which ions and/or radical constituents are derived for use in either directly or indirectly affecting a change on a surface of a substrate exposed to the plasma. For example, various plasma-based processes can be used to etch material from a substrate surface, deposit material onto a substrate surface, or modify a material already present on a substrate surface. The plasma is often generated by applying radiofrequency (RF) power to a process gas in a controlled environment, such that the process gas becomes energized and transforms into the desired plasma. The characteristics of the plasma are affected by many process parameters including, but not limited to, material composition of the process gas, flow rate of the process gas, geometric features of the plasma generation region and surrounding structures, temperatures of the process gas and surrounding materials, frequency of the RF power applied, magnitude of the RF power applied, and temporal manner in which the RF power is applied, among others. Therefore, it is of interest to understand, monitor, and/or control some of the process parameters that may affect the characteristics of the generated plasma, particularly with regard to delivery of the RF power to the plasma generation region. It is within this context that the present disclosure arises.

SUMMARY

In an example embodiments, a method is disclosed for automated frequency tuning of an RF signal generator for operating in a multi-level RF power pulsing mode. The method includes defining a two-dimensional frequency search grid having a first coordinate axis representing an operating frequency setpoint of the RF signal generator in a first operational state and having a second coordinate axis representing an operating frequency setpoint of the RF signal generator in a second operational state. The RF signal generator has a first output power level in the first operational state and a second output power level in the second operational state, where the first and second output power levels are different from each other. The RF signal generator is programmed to operate in the multi-level RF power pulsing mode by cyclically alternating between the first operational state and the second operational state. The method also includes performing an automated search process within the two-dimensional frequency search grid to simultaneously determine a first optimum value for the operating frequency setpoint of the RF signal generator in the first operational state and a second optimum value for the operating frequency setpoint of the RF signal generator in the second operational state. The method also includes setting the RF signal generator to operate using the first optimum value for the operating frequency setpoint of the RF signal generator in the first operational state and the second optimum value for the operating frequency setpoint of the RF signal generator in the second operational state.

In example embodiment, a system is disclosed for automated frequency tuning of an RF signal generator for operating in a multi-level RF power pulsing mode. The system includes a plasma processing chamber that includes a substrate support structure and an electrode. The system also includes an RF signal generator configured to generate RF signals and transmit the RF signals through an output of the RF signal generator. The RF signal generator is set to have a first output power level in a first operational state and a second output power level in a second operational state, where the first and second output power levels are different from each other. The RF signal generator is programmed to operate in the multi-level RF power pulsing mode by cyclically alternating between the first operational state and the second operational state. The system also includes an impedance matching system having an input connected to the output of the RF signal generator. The impedance matching system has an output connected to the electrode. The impedance matching system is configured to control an impedance at the output of the RF signal generator to enable transmission of the RF signals through the electrode to a plasma generated within the plasma processing chamber. The system also includes a control system programmed to define a two-dimensional frequency search grid having a first coordinate axis representing an operating frequency setpoint of the RF signal generator in the first operational state and a second coordinate axis representing an operating frequency setpoint of the RF signal generator in the second operational state. The control system is programmed to perform an automated search process within the two-dimensional frequency search grid to simultaneously determine a first optimum value for the operating frequency setpoint of the RF signal generator in the first operational state and a second optimum value for the operating frequency setpoint of the RF signal generator in the second operational state.

Other aspects and advantages of the invention will become more apparent from the following detailed description, taken in conjunction with the accompanying drawings, illustrating by way of example the present invention.

DETAILED DESCRIPTION

Figure 1A:
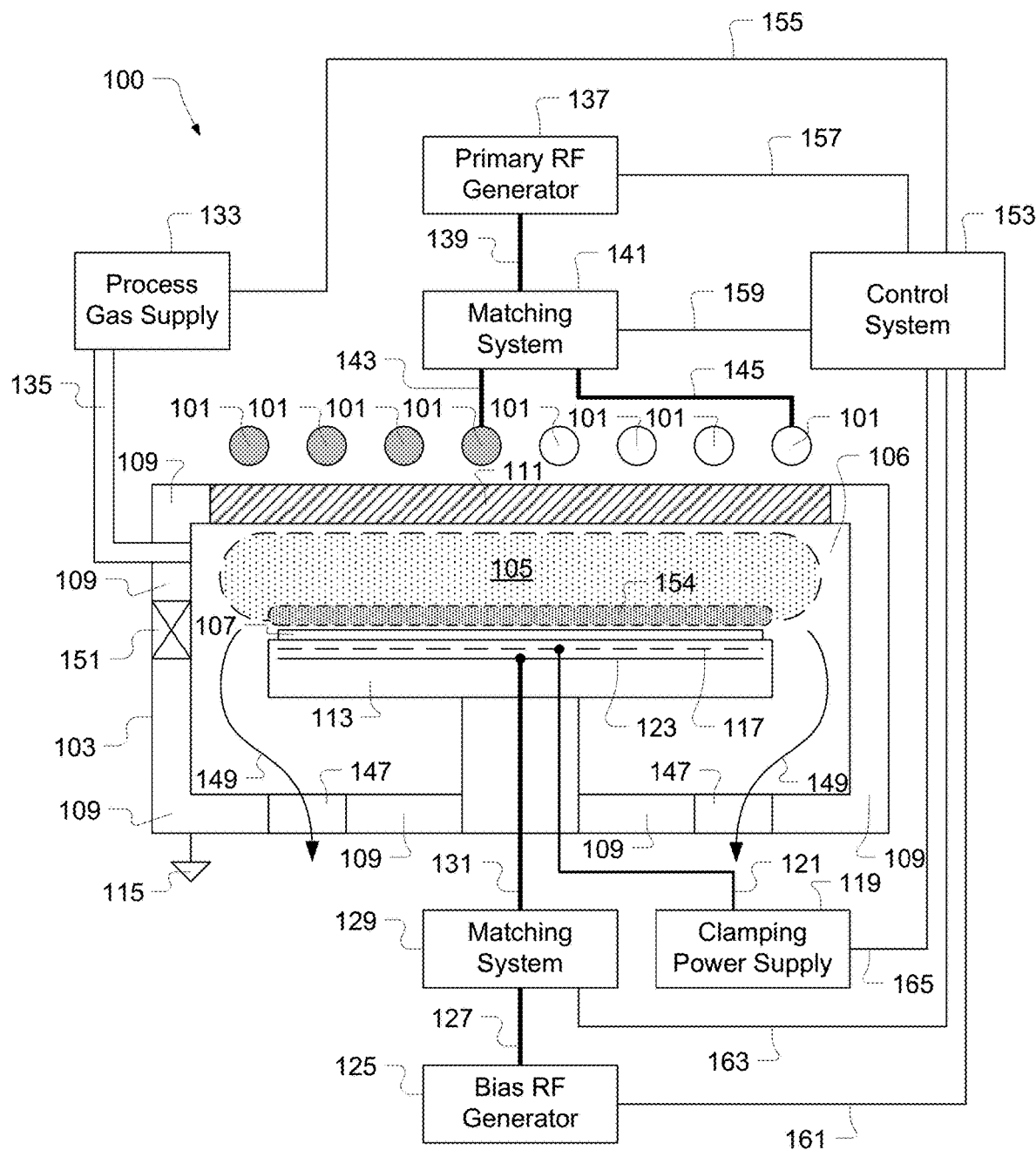
FIG. 1A shows a vertical cross-section view of a plasma processing system for use in manufacturing semiconductor wafers, in accordance with some embodiments.

In the following description, numerous specific details are set forth in order to provide an understanding of embodiments of the present disclosure. It will be apparent, however, to one skilled in the art that embodiments of the present disclosure may be practiced without some or all of these specific details. In other instances, well known process operations have not been described in detail in order not to unnecessarily obscure the present disclosure.

Embodiments are disclosed herein for an automated method and corresponding system through which semiconductor fabrication plasma processing recipe steps that include multi-level radiofrequency (RF) power pulsing can be frequency-tuned for optimal RF stability and performance. The embodiments disclosed herein can be implemented in conjunction with essentially any semiconductor fabrication plasma processing tool that is equipped to provide for multi-level pulsing of RF power to and electrode and/or antenna (coil), such as a conductor etch semiconductor fabrication plasma processing tool, among other semiconductor fabrication plasma processing tools. An automated frequency tuner is disclosed herein that simultaneously optimizes and considers the following quantities, where RF State 1 is a high power operating state of an RF generator and RF State 2 is a low power operating state of the RF generator, or vice-versa:

Reflected RF power for RF State 1,
Reflected RF power for RF State 2,
Deviation of an applied RF voltage/power from a setpoint RF voltage/power for RF State 1, and Deviation of an applied RF voltage/power from a preset setpoint RF voltage/power for RF State 2.

Optimization of the four quantities identified above corresponds to a collective minimization of the four quantities identified above. The automated frequency tuner includes an optimizer that uses a search triangulation process to determine a prescribed frequency tune point on a constrained two-dimensional (2D) frequency search grid that corresponds to collective minimization of the four quantities identified above through evaluation of a cost function, where a first dimension of the 2D frequency search grid is a setpoint frequency of an RF generator operating in RF State 1, and where a second dimension of the 2D frequency search grid is a preset setpoint frequency of an RF generator operating in RF State 2. The result of the search triangulation process is an optimal set of setpoint frequency coordinates within the 2D frequency search grid that includes: 1) an optimal setpoint frequency for the RF generator operating in RF State 1, and 2) an optimal preset setpoint frequency for the RF generator operating in RF State 2. Using data log parameters available from a user interface (UI) of the plasma processing system, the automated frequency tuner performs the search triangulation process on the 2D frequency search grid and returns the optimal set of frequency coordinates that satisfy stable RF generator operating conditions.

In the semiconductor industry, semiconductor substrates can undergo fabrication operations in various types of plasma chambers, such as capacitively coupled plasma (CCP) processing chambers and inductively coupled plasma (ICP) plasma processing chambers. In both CCP and ICP processing chambers, radiofrequency (RF) power is used to energize a process gas to transform the process gas into a plasma within a plasma processing region to which the substrate is exposed. Reactive species and/or charged species within the plasma interact with the substrate to modify a condition of the substrate, such as by modifying a material present on the substrate, or by depositing material on the substrate, or by removing/etching material from the substrate, by way of example. The CCP and ICP processing chambers can be equipped with one or more electrodes that receive RF power for generating the plasma within the plasma processing region. Also, the CCP and ICP processing chambers can also be equipped with one or more electrodes that receive RF power for generating a bias voltage at the substrate location (at the wafer level) for attracting charged species from the plasma toward the substrate.

Figure 1B:
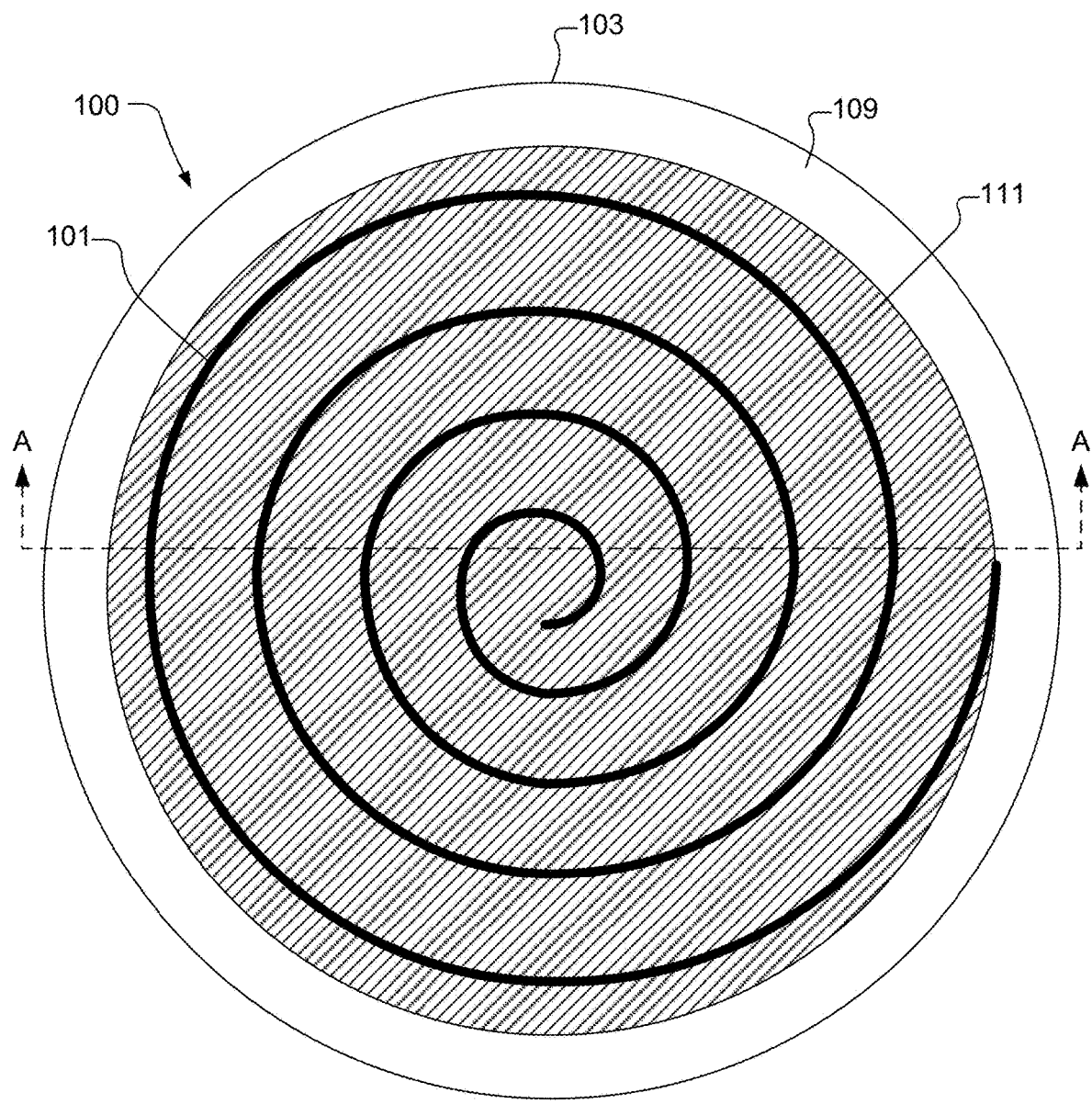
FIG. 1B shows a top view of the plasma processing system of FIG. 1A, in accordance with some embodiments.

FIG. 1A shows a vertical cross-section view of a plasma processing system 100 for use in manufacturing semiconductor wafers, in accordance with some embodiments. FIG. 1B shows a top view of the plasma processing system of FIG. 1A, in accordance with some embodiments. The vertical cross-section view of FIG. 1A is referenced as View A-A in FIG. 1B. The plasma processing system 100 of FIG. 1A is an example of the ICP type of plasma processing system. It should be understood that the automated frequency tuning method and corresponding systems disclosed herein can be performed and implemented with both ICP and CCP types of plasma processing systems, as well as with other types of plasma processing systems in which an RF signal generator is operated to supply RF power in a cyclically pulsed manner between different power levels, where the RF signal generator has a different optimum operating frequency setpoint at the different power levels. However, for ease of description, the automated frequency tuning method and corresponding systems are described herein with regard to the example ICP type of plasma processing system as shown in FIGS. 1A and 1B. Also, the ICP processing chamber can be referred to as a transformer coupled plasma (TCP) processing chamber. For ease of discussion herein, the ICP processing chamber will be used to refer to both ICP and TCP processing chambers. It should be understood that the plasma processing system 100 represents essentially any type of ICP processing chamber in which RF signals are transmitted from a coil 101 disposed outside a processing chamber 103 to a process gas within the processing chamber 103 to generate a primary plasma 105 within a plasma processing volume 106 of the processing chamber 103, where the primary plasma 105 is used to affect a change in a condition of a substrate 107 held in exposure to constituents of the primary plasma 105. FIG. 1A shows the coil 101 from which RF signals are transmitted into the plasma processing volume 106 to generate the primary plasma 105 within the plasma processing volume 106 in exposure to a substrate 107. The coil 101 is also referred to as a primary electrode.

In some embodiments, the substrate 107 is a semiconductor wafer undergoing a fabrication procedure. However, it should be understood that in various embodiments, the substrate 107 can be essentially any type of substrate that is subjected to a plasma-based fabrication process. For example, in some embodiments, the term substrate 107 as used herein can refer to substrates formed of sapphire, GaN, GaAs or SiC, or other substrate materials, and can include glass panels/substrates, metal foils, metal sheets, polymer materials, or the like. Also, in various embodiments, the substrate 107 as referred to herein may vary in form, shape, and/or size. For example, in some embodiments, the substrate 107 referred to herein may correspond to a 200 mm (millimeters) semiconductor wafer, a 300 mm semiconductor wafer, or a 450 mm semiconductor wafer. Also, in some embodiments, the substrate 107 referred to herein may correspond to a non-circular substrate, such as a rectangular substrate for a flat panel display, or the like, among other shapes.

The plasma processing volume 106 of the processing chamber 103 is formed within a surrounding structure 109, and below an upper window structure 111, and above a substrate support structure 113. In some embodiments, the surrounding structure 109 is formed of an electrically conductive material, such as a metal, that is mechanically and chemically compatible with the environment and materials present within the plasma processing volume 106 during operation of the plasma processing system 100. In these embodiments, the surrounding structure 109 can be electrically connected to a reference ground potential 115. The processing chamber 103 includes a door 151 through which the substrate 107 can be moved into and removed from the plasma processing volume 106.

The substrate support structure 113 is configured to support the substrate 107 in a secure manner in exposure to the primary plasma 105 generated within the plasma processing volume 106. In some embodiments, the substrate support structure 113 is an electrostatic chuck that includes one or more clamp electrode(s) 117 to which electric power can be supplied by a clamping power supply 119 through an electrical connection 121. The electric power supplied to the one or more clamp electrode(s) 117 generates an electrostatic field for clamping the substrate 107 onto the substrate support structure 113. In various embodiments, the clamping power supply 119 can be configured to supply either RF power, direct current (DC) power, or a combination of both RF power and DC power to the one or more clamp electrode (s) 117. In the embodiments in which the clamping power supply 119 is configured to supply RF power, the clamping power supply 119 further includes an impedance matching circuit through which the RF power is transmitted to ensure that the RF power is not unacceptably reflected from the one or more clamp electrode(s) 117. In these embodiments, the impedance matching circuit within the clamping power supply 119 includes an arrangement of capacitors and/or inductors.

The substrate support structure 113 can also include a bias electrode 123 to which RF bias power can be supplied to generate a bias voltage ($V_b$) at the substrate 107 level within the plasma processing volume 106. The RF power transmitted from the bias electrode 123 into the plasma processing volume 106 is referred to as the bias RF power. In some embodiments, the bias RF power is generated by a bias RF signal generator 125 and is transmitted through an electrical connection 127 to an impedance matching system 129, and is then transmitted from the impedance matching system 129 through a transmission rod 131 to the bias electrode 123. The transmission rod 131 is electrically insulated from the surrounding structure 109 of the processing chamber 103. The impedance matching system 129 includes an arrangement of capacitors and/or inductors configured to ensure that an impedance at an output of the bias RF signal generator 125 is sufficiently close to a load impedance for which the bias RF signal generator 125 is designed to operate (usually about 50 Ohms), so that RF signals generated and transmitted by the bias RF signal generator 125 will be transmitted into the plasma processing volume 106 in an efficient manner, i.e., without unacceptable reflection.

The plasma processing system 100 operates by flowing one or more process gases from a process gas supply 133 through an arrangement of fluid conveyance structures 135 into the plasma processing volume 106, and by applying RF power from the coil 101 to the one or more process gases to transform the one or more process gases into the primary plasma 105 in exposure to the substrate 107, in order to affect a change in material or surface condition on the substrate 107. The used process gases and other materials that result from processing of the substrate 107 are exhausted from the plasma processing volume 106 through one or more exhaust ports 147, as indicated by the arrows 149.

The coil 101 is disposed above the upper window structure 111. In the example of FIGS. 1A and 1B, the coil 101 is formed as a radial coil assembly, with the shaded parts of the coil 101 turning into the page of the drawing and with the unshaded parts of the coil 101 turning out of the page of the drawing. It should be understood that the coil 101 of FIGS. 1A and 1B is presented by way of example. In some embodiments, the coil 101 can include multiple zones, with each zone spanning a specified corresponding radial extent above the upper window structure 111. In these embodiments, the RF power supplied to each zone of the coil 101 is independently controlled. Also, it should also be understood that the number of turns (about the center of the upper window structure 111) of the example coil 101 of FIGS. 1A and 1B is presented by way of example. In various embodiments, the coil 101 can have any number of turns and any cross-section size and shape (circular, oval, rectangular, trapezoidal, etc.) as required to provide the necessary transmission of RF signals through the upper window structure 111 into the plasma processing volume 106. It should be understood that in various embodiments the coil 101 can be of essentially any configuration that is suitable for transmitting RF power through the upper window structure 111 and into the plasma processing volume 106.

The RF power transmitted from the coil 101 into the plasma processing volume 106 is referred to as the plasma primary RF power. The plasma primary RF power is generated by a primary RF signal generator 137 and is transmitted through an electrical connection 139 to an impedance matching system 141, and through an electrical connection 143 to the coil 101. Also, in some embodiments, a return electrical connection 145 extends from the coil 101 to the impedance matching system 141. The impedance matching system 141 includes an arrangement of capacitors and/or inductors configured to ensure that an impedance at an output of the primary RF signal generator 137 is sufficiently close to a load impedance for which the primary RF signal generator 137 is designed to operate (usually about 50 Ohms), so that RF signals supplied to the coil 101 by the primary RF signal generator 137 will be transmitted into the plasma processing volume 106 in an efficient manner without unacceptable reflection.

The plasma processing system 100 also includes a control system 153 configured and connected to control operations of the plasma processing system 100. The control system 153 is connected to the process gas supply 133, through a connection 155, to provide for control of the process gas supply 133. The control system 153 is connected to the primary RF signal generator 137, through a connection 157, to provide for control of the primary RF signal generator 137. The control system 153 is connected to the impedance matching system 141, through a connection 159, to provide for control the impedance matching system 141. The control system 153 is connected to the bias RF signal generator 125, through a connection 161, to provide for control of the bias RF signal generator 125. The control system 153 is connected to the impedance matching system 129, through a connection 163, to provide for control of the impedance matching system 129. The control system 153 is connected to the clamping power supply 119, through a connection 165, to provide for control of the clamping power supply 119. It should be understood that in various embodiments, any of the connections 155, 157, 159, 161, 163, and 165 can be either a wired connection, a wireless connection, an optical connection, or a combination thereof. It should be understood that in various embodiments, the control system 153 is configured to and connected to control essentially any feature of the plasma processing system 100 that lends itself to active control. Also, it should be understood that in various embodiments, the control system 153 is connected to various metrology and sensors and other data acquisition devices disposed throughout the plasma processing system 100 to measure and monitor any and all parameters that are relevant to operation of the plasma processing system 100. Also, in various embodiments, data/signal connection(s) between the control system 153 and each of the various metrology and sensors and other data acquisition devices can be either a wired connection, a wireless connection, an optical connection, or a combination thereof.

Figure 1C:
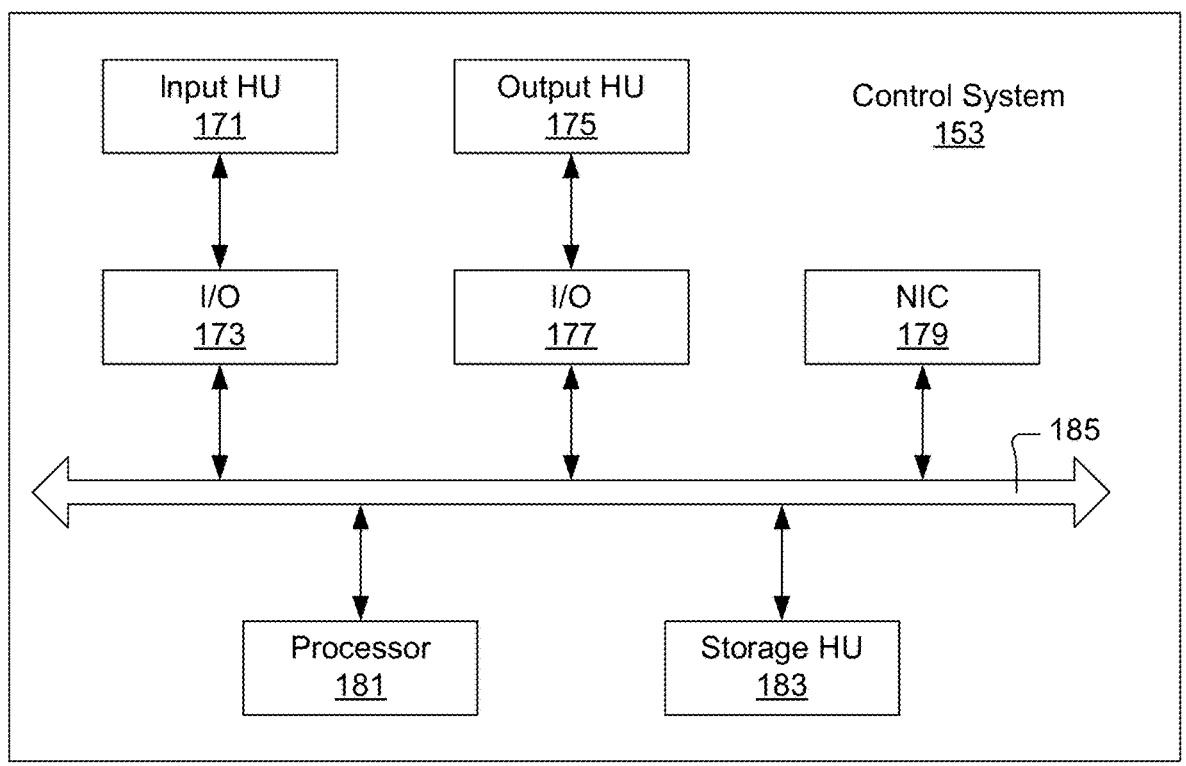
FIG. 1C shows a diagram of the control module, in accordance with some embodiments.

FIG. 1C shows a diagram of the control system 153, in accordance with some embodiments. The control system 153 includes a processor 181, a storage hardware unit (HU) 183 (e.g., memory), an input HU 171, an output HU 175, an input/output (I/O) interface 173, an I/O interface 177, a network interface controller (NIC) 179, and a data communication bus 185. The processor 181, the storage HU 183, the input HU 171, the output HU 175, the I/O interface 173, the I/O interface 177, and the NIC 179 are in data communication with each other by way of the data communication bus 185. Examples of the input HU 171 include a mouse, a keyboard, a stylus, a data acquisition system, a data acquisition card, etc. The input HU 171 is configured to receive data communication from a number of external devices, such as from the process gas supply 133, the primary RF signal generator 137, the impedance matching system 141, the bias RF signal generator 125, the impedance matching system 129, the clamping power supply 119, and/or any other device within the plasma processing system 100. Examples of the output HU 175 include a display, a speaker, a device controller, etc. The output HU 175 is configured to transmit data to a number of external devices, such as to the process gas supply 133, the primary RF signal generator 137, the impedance matching system 141, the bias RF signal generator 125, the impedance matching system 129, the clamping power supply 119, and/or any other device within the plasma processing system 100.

Examples of the NIC 179 include a network interface card, a network adapter, etc. In various embodiments, the NIC 179 is configured to operate in accordance with one or more communication protocols and associated physical layers, such as Ethernet and/or EtherCAT, among others. Each of the I/O interfaces 173 and 177 is defined to provide compatibility between different hardware units coupled to the I/O interface. For example, the I/O interface 173 can be defined to convert a signal received from the input HU 171 into a form, amplitude, and/or speed compatible with the data communication bus 185. Also, the I/O interface 177 can be defined to convert a signal received from the data communication bus 185 into a form, amplitude, and/or speed compatible with the output HU 175. Although various operations described herein are performed by the processor 181 of the control system 153, it should be understood that in some embodiments various operations can be performed by multiple processors of the control system 153 and/or by multiple processors of multiple computing systems in data communication with the control system 153.

Also, in some embodiments, there is a user interface (UI) associated with the control system 153. The user interface may include a display (e.g., a display screen and/or graphical software displays of the apparatus and/or process conditions) and user input devices such as pointing devices, keyboards, touch screens, microphones, etc. In some embodiments, the UI of the control system 153 can provide a UI for one or more of the process gas supply 133, the primary RF signal generator 137, the impedance matching system 141, the bias RF signal generator 125, the impedance matching system 129, the clamping power supply 119, and/or any other device within the plasma processing system 100. More specifically, any of the process gas supply 133, the primary RF signal generator 137, the impedance matching system 141, the bias RF signal generator 125, the impedance matching system 129, the clamping power supply 119, and/or any other device within the plasma processing system 100, can include integrated electronics for controlling their operation before, during, and after processing of the substrate 107. In some embodiments, the integrated electronics in each device within the plasma processing system 100 are connected to the control system 153 by way of the NIC 179, to enable a process engineer to use the control system 153 to control any device within the plasma processing system 100.

The control system 153 can be configured to execute computer programs including sets of instructions for controlling operation of the process gas supply 133, the primary RF signal generator 137, the impedance matching system 141, the bias RF signal generator 125, the impedance matching system 129, the clamping power supply 119, and/or any other controllable device within the plasma processing system 100. The control system 153 is programmable to control any of the processes disclosed herein, including the delivery of processing gases, temperature settings (e.g., heating and/or cooling), pressure settings, vacuum settings, power settings, RF generator settings, impedance matching system settings, frequency settings, flow rate settings, fluid delivery settings, positional and operation settings, wafer transfers into and out of the processing chamber 103, and other wafer transfer tools and/or load locks connected to or interfaced with a plasma processing system 100. Also, computer programs stored on memory devices associated with the control system 153 may be employed in some embodiments. Software for directing operation of the control system 153 may be designed or configured in many different ways. Computer programs for directing operation of the control system 153 to in turn direct operation of the plasma processing system 100 can be written in any conventional computer readable programming language: for example, assembly language, C, C++, Pascal, Fortran or others. Compiled object code or script is executed by the processor 181 to perform the tasks identified in the program.

The control system 153 is defined as electronics having various integrated circuits, logic, memory, and/or software that receive instructions, issue instructions, and control operations. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the control system 153 in the form of various individual settings (or program files), defining operational parameters for operating the plasma processing system 100 to carrying out a prescribed process on the substrate 107. The operational parameters may, in some embodiments, be part of a recipe defined by a process engineer to accomplish one or more processing steps during the fabrication of one or more layers, materials, metals, oxides, silicon, silicon dioxide, surfaces, circuits, and/or dies of on the substrate 107.

In some embodiments, the control system 153 is implemented in the "cloud" or in part of a fab host computer system, which allows for remote access to control the plasma processing system 100. In some embodiments, the control system 153 enables remote access to the plasma processing system 100 provide for monitoring of current progress of fabrication operations, examination of the history of past fabrication operations, examination of trends or performance metrics from a plurality of fabrication operations, adjustment of parameters associated with current processing operations, setting of processing steps to follow a current processing operation, or starting of a new processing operation. In some examples, access of the control system 153 through a remote computer (e.g., a server) can be used to provide process recipes to the plasma processing system 100 over a network, which may include a local network or the Internet. By way of the remote computer, the control system 153 can provide a user interface that enables entry or programming of parameters and/or settings, which are then communicated to the plasma processing system 100 from the remote computer. In some examples, the control system 153 receives instructions in the form of data, which specify parameters for each of the processing steps to be performed during one or more operations. It should be understood that the parameters may be specific to the type of process to be performed and the type of tool that the controller is configured to interface with or control. Thus, the control system 153 may be distributed, such as by comprising one or more discrete controllers that are networked together and working towards a common purpose, such as the processes and controls described herein. An example of a distributed control system 153 for such purposes would be one or more integrated circuits within the plasma processing system 100 in communication with one or more integrated circuits located remotely (such as at the platform level or as part of a remote computer) that combine to control performance of a process within the plasma processing system 100.

Figure 2:
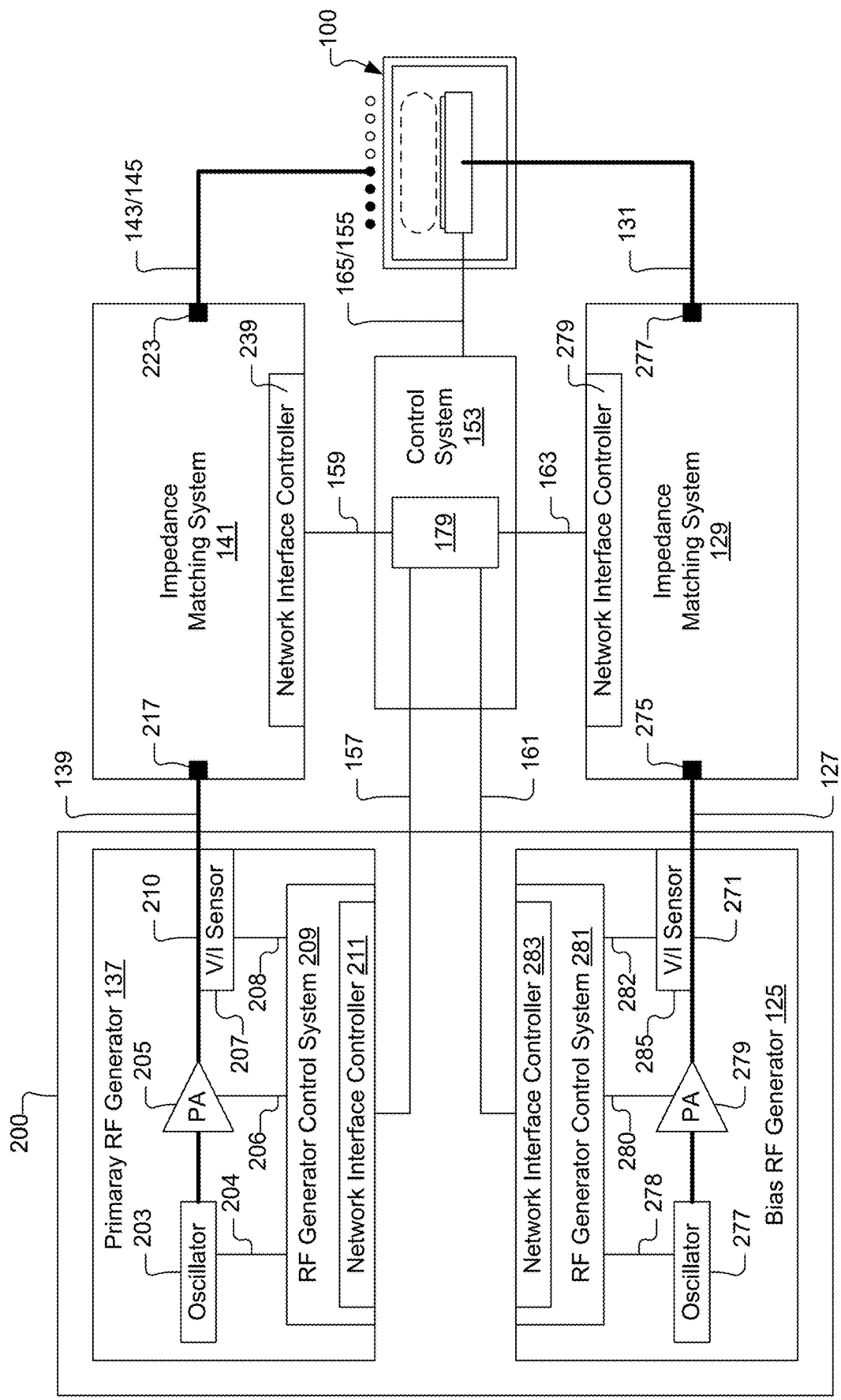
FIG. 2 shows an RF signal generator system that includes the primary RF signal generator and the bias RF signal generator, in accordance with some embodiments.

FIG. 2 shows an RF signal generator system 200 that includes the primary RF signal generator 137 and the bias RF signal generator 125, in accordance with some embodiments. The primary RF signal generator 137 is connected to supply RF signals from an output 210 of the primary RF signal generator 137 through the connection 139 to an input 217 of the impedance matching system 141, and from an output 223 of the impedance matching system 141 through the connection 143 to the coil 101 of the plasma processing system 100. The bias RF signal generator 125 is connected to supply RF signals from an output 271 of the bias RF signal generator 125 through the connection 127 to an input 275 of the impedance matching system 129, and from an output 277 of the impedance matching system 129 through the connection 131 to the bias electrode 123 of the plasma processing system 100.

The impedance matching system 141 includes a combination of capacitors and inductors connected in an electrical circuit to match an impedance at the output 210 of the primary RF signal generator 137 to a design impedance (usually 50 Ohms). The impedance matching system 129 also includes a combination of capacitors and inductors connected in an electrical circuit to match an impedance at the output 271 of the bias RF signal generator 125 to a design impedance (usually 50 Ohms). The impedance matching system 141 also includes a NIC 239 that enables the impedance matching system 141 to send data to and receive data from systems outside of the impedance matching system 141. The NIC 239 of the impedance matching system 141 is in data communication with the NIC 179 of the control system 153, as indicated by connection 159. Also, the impedance matching system 129 includes a network interface controller 279 that enables the impedance matching system 129 to send data to and receive data from systems outside of the impedance matching system 129. The NIC 279 of the impedance matching system 129 is in data communication with the NIC 179 of the control system 153, as indicated by connection 163. Examples of the NIC's 239 and 279, respectively, include a network interface card, a network adapter, etc. In various embodiments, the NIC's 239 and 279 are configured to operate in accordance with one or more network communication protocols and associate physical layers, such as Ethernet and/or EtherCAT, among others.

The primary RF signal generator 137 includes an oscillator 203 for generating RF signals. The oscillator 203 is an electronic circuit that produces a periodic oscillating electrical signal, such a sine wave electrical signal, having a specified frequency within the RF range. The oscillator 203 is capable of oscillating at a set frequency, where the set frequency is within a range extending up to about 100 megaHertz (MHz) in some embodiments. With regard to numerical values disclosed herein, the term "about" as used herein means within plus or minus 10% of a given numerical value. In some embodiments, the oscillator 203 is set to oscillate within a frequency range extending from about 11 MHz to about 15 MHz. In some embodiments, the oscillator 203 is set to oscillate within a frequency range extending from about 12.882 MHz to about 14.238 MHz. An output of the oscillator 203 is connected to an input of a power amplifier 205. The power amplifier 205 operates to amplify the RF signals generated by the oscillator 203, and transmit the amplified RF signals through an output of the power amplifier 205 to the output 210 of the primary RF signal generator 137.

The primary RF signal generator 137 also includes a control system 209 configured to provide for control of all operational aspects of the primary RF signal generator 137. In some embodiments, the control system 209 is configured in a similar manner as the control system 153 of the plasma processing system 100. For example, in some embodiments, the control system 209 includes a processor, a data storage device, an input/output interface, and a data bus through which the processor, the data storage device, and the input/output interface communicate data to and from each other. The control system 209 is connected to provide for control of the oscillator 203, as indicated by connection 204. The control system 209 is also connected to provide for control of the power amplifier 205, as indicated by connection 206. The primary RF signal generator 137 also includes a voltage/current (V/I) sensor 207 connected to the output 210 of the primary RF signal generator 137. The V/I sensor 207 is connected to the control system 209, as shown by connection 208. In this configuration, the V/I sensor 207 provides a real-time measurement of voltage and current present on the output 210 of the primary RF signal generator 137 to the control system 209.

The control system 209 also includes a NIC 211 that enables the control system 209 to send data to and receive data from systems outside of the primary RF signal generator 137. The NIC 211 of the primary RF signal generator 137 is in data communication with the NIC 179 of the control system 153, as indicated by connection 157. Examples of the NIC 211 include a network interface card, a network adapter, etc. In various embodiments, the NIC 211 is configured to operate in accordance with one or more network communication protocols and associate physical layers, such as Ethernet and/or EtherCAT, among others.

It should be understood that the control system 209 is connected to and configured to control essentially any aspect of the primary RF signal generator 137. And, it should be understood that the control system 209 can be connected to and configured to monitor essentially any physical and/or electrical state, condition, and/or parameter at essentially any location within the primary RF signal generator 137. The control system 209 is also configured to direct operation of the primary RF signal generator 137 in accordance with a prescribed algorithm. For example, the control system 209 is configured to operate the primary RF signal generator 137 by executing input and control instructions/programs. The input and control instructions/programs include a target RF power setpoint and a target frequency setpoint, as a function of time, among other parameters associated with operation and control of the primary RF signal generator 137.

The bias RF signal generator 125 includes an oscillator 277 for generating RF signals. The oscillator 277 is an electronic circuit that produces a periodic oscillating electrical signal, such a sine wave electrical signal, having a specified frequency within the RF range. The oscillator 277 is capable of oscillating at a set frequency, where the set frequency is within a range extending up to about 100 megaHertz (MHz) in some embodiments. In some embodiments, the oscillator 277 is set to oscillate within a frequency range extending from about 11 MHz to about 15 MHz. In some embodiments, the oscillator 277 is set to oscillate within a frequency range extending from about 12.882 MHz to about 14.238 MHz. In some embodiments, the oscillator 277 is set to oscillate within a frequency range extending from about 0.9 MHz to about 1.1 MHz. An output of the oscillator 277 is connected to an input of a power amplifier 279. The power amplifier 279 operates to amplify the RF signals generated by the oscillator 277, and transmit the amplified RF signals through an output of the power amplifier 279 to the output 271 of the bias RF signal generator 125.

The bias RF signal generator 125 also includes a control system 281 configured to provide for control of all operational aspects of the bias RF signal generator 125. In some embodiments, the control system 281 is configured in a similar manner as the control system 153 of the plasma processing system 100. For example, in some embodiments, the control system 281 includes a processor, a data storage device, an input/output interface, and a data bus through which the processor, the data storage device, and the input/output interface communicate data to and from each other. The control system 281 is connected to provide for control of the oscillator 277, as indicated by connection 278. The control system 281 is also connected to provide for control of the power amplifier 279, as indicated by connection 280. The bias RF signal generator 125 also includes a voltage/current (V/I) sensor 285 connected to the output 271 of the bias RF signal generator 125. The V/I sensor 285 is connected to the control system 281, as shown by connection 282. In this configuration, the V/I sensor 285 provides a real-time measurement of voltage and current present on the output 271 of the bias RF signal generator 125 to the control system 281.

The control system 281 also includes a NIC 283 that enables the control system 281 to send data to and receive data from systems outside of the bias RF signal generator 125. The NIC 283 of the bias RF signal generator 125 is in data communication with the NIC 179 of the control system 153, as indicated by connection 161. Examples of the NIC 283 include a network interface card, a network adapter, etc. In various embodiments, the NIC 283 is configured to operate in accordance with one or more network communication protocols and associate physical layers, such as Ethernet and/or EtherCAT, among others.

It should be understood that the control system 281 is connected to and configured to control essentially any aspect of the bias RF signal generator 125. And, it should be understood that the control system 281 can be connected to and configured to monitor essentially any physical and/or electrical state, condition, and/or parameter at essentially any location within the bias RF signal generator 125. The control system 281 is also configured to direct operation of the bias RF signal generator 125 in accordance with a prescribed algorithm. For example, the control system 281 is configured to operate the bias RF signal generator 125 by executing input and control instructions/programs. The input and control instructions/programs include a target RF power setpoint and a target frequency setpoint, as a function of time, among other parameters associated with operation and control of the bias RF signal generator 125.

In some embodiments, the control system 209 of the primary RF signal generator 137 is programmed to determine a real-time reflection coefficient (or Gamma ($\Gamma$)) at the output 210 of the primary RF signal generator 137, where $\Gamma=V_r/V_f$, with $V_r$ being the complex amplitude of the reflected RF signal, and with $V_f$ being the complex amplitude of the forward RF signal. Also, in some embodiments, the control system 209 of the primary RF signal generator 137 is also programmed to determine a voltage standing wave ratio (VSWR) at the output 210 of the primary RF signal generator 137, where VSWR=$|V_{max}|/|V_{min}|=(1+|\Gamma|)/(1-|\Gamma|)$, with $|V_{max}|=|V_f|+|V_r|$ and $|V_{min}|=|V_f|-|V_r|$. Minimization of the reflected RF power associated with the RF signals generated by the primary RF signal generator 137 occurs when the reflection coefficient at the output 210 of the primary RF signal generator 137 is as close to zero as possible. Also, minimization of the reflected RF power associated with the RF signals generated by the primary RF signal generator 137 occurs when the VSWR at the output 210 of the primary RF signal generator 137 is as close to one as possible, where one is the minimum possible value of VSWR. In some embodiments, the control system 209 is programmed to use the real-time measured voltage on the output 210 of the primary RF signal generator 137 to calculate the real-time reflection coefficient and/or VSWR at the output 210 of the primary RF signal generator 137. The real-time reflection coefficient and/or VSWR at the output 210 of the primary RF signal generator 137, as determined using voltage measurements taken at the output 210 of the primary RF signal generator 137, can be used in a cost function to optimize a frequency setpoint of the primary RF signal generator 137.

Similarly, in some embodiments, the control system 281 of the bias RF signal generator 125 is programmed to determine the reflection coefficient (or Gamma ($\Gamma$)) and VSWR at the output 271 of the bias RF signal generator 125. Minimization of the reflected RF power associated with the RF signals generated by the bias RF signal generator 125 occurs when the reflection coefficient at the output 271 of the bias RF signal generator 125 is as close to zero as possible. Also, minimization of the reflected RF power associated with the RF signals generated by the bias RF signal generator 125 occurs when the VSWR at the output 271 of the bias RF signal generator 125 is as close to one as possible, where one is the minimum possible value of VSWR. In some embodiments, the control system 281 is programmed to use the real-time measured voltage on the output 271 of the bias RF signal generator 125 to calculate the real-time reflection coefficient and/or VSWR at the output 271 of the bias RF signal generator 125. The real-time reflection coefficient and/or VSWR at the output 271 of the bias RF signal generator 125, as determined using voltage measurements taken at the output 271 of the bias RF signal generator 125, can be used as a feedback signal to minimize the reflection coefficient to as close to zero as possible and/or to minimize the VSWR to as close to one as possible at the output 271 of the high frequency RF signal generator 202. Also, the real-time reflection coefficient and/or VSWR at the output 271 of the high frequency RF signal generator 202, as determined using voltage measurements taken within the high frequency RF signal generator 202, can be used in a cost function to optimize a frequency setpoint of the bias RF signal generator 125.

The plasma processing system 100 has certain advantages in plasma process control in various plasma-based semiconductor fabrication applications, such as in plasma etching, by way of example. The plasma processing system 100 provides for separate control of plasma density (ion flux/radical flux) and ion energy. Specifically, the plasma density can be controlled to a certain extent by the plasma primary RF power that is transmitted from the primary RF signal generator 137 to the coil 101 and through the upper window structure 111 into the plasma processing volume 106. And, the ion energy can be controlled by the bias voltage ($V_b$) that is generated at the substrate level by the bias RF power that is transmitted from the bias RF signal generator 125 to the bias electrode 123 and into the plasma processing volume 106. Separate control of plasma density (which directly correlates to ion flux and radical flux) and ion energy is particularly useful in some semiconductor fabrication applications. For example, in patterning applications where high plasma density is needed to obtain a required etch rate and where low ion energy is required to reduce damage to one or more materials present on the substrate, such as photoresist material. It should be understood that in addition to patterning applications, many other plasma-based semiconductor fabrication applications can also benefit from separate control of plasma density and ion energy. For example, separate control of plasma density and ion energy can be useful in high aspect ratio (HAR) etching applications where high ion energy and directionality is needed to maintain an etch front at the bottom of deep trenches and/or holes. In some embodiments, the plasma primary RF power/frequency and the bias RF power/frequency may need to be controlled in different ways at the same time to achieve a desired result. For example, in some embodiments, to obtain increased plasma density in conjunction with low ion energy, the plasma primary RF power needs to be high and at the same time the bias RF power needs to be low.

In some situations, the plasma primary RF power transmitted from the coil 101 through the upper dielectric window 111 into the plasma processing volume 106 does not provide enough plasma density at the substrate 107 level to obtain a necessary etch rate and/or etch selectivity. One reason for this is that the density of the primary plasma 105 generated by the plasma primary RF power transmitted from the coil 101 decreases with increased distance from the coil 101. Therefore, with increased distance between the coil 101 and the substrate support structure 113, it becomes more difficult to obtain a required plasma density at the substrate 107 level. Also, the lower frequency of the bias RF power that is applied to the bias electrode 123 generates a DC bias voltage ($V_b$) on the substrate 107 without contributing much to the plasma density near the substrate 107. Additionally, it may not be possible to simply increase the plasma primary RF power supplied to the coil 101 beyond a specified maximum amount, such as about 3 kW (kiloWatts), due to potential damage caused by overheating of the upper window structure 111. Also, reducing the distance between the coil 101 and substrate support structure 113 may require a costly redesign of the processing chamber 103, and potentially cause problems with regard to plasma uniformity at the substrate 107 level, and present other challenges.

It is possible to provide an increase in plasma density at the substrate 107 level without causing an increase in ion energy at the substrate 107 level. The bias electrode 123 can be used to transmit specially controlled RF signals into the plasma processing volume 106 to generate a supplemental plasma density 154 (see FIG. 1A) locally at the substrate 107 level. At the substrate 107 level, the effective plasma density is the sum of the plasma density generated by the plasma primary RF power supplied to the coil 101 and the supplemental plasma density 154 generated by the bias RF power supplied to the bias electrode 123. In various embodiments, it is possible to generate the supplemental plasma density 154 locally at the substrate 107 level either with or without increasing the ion energy at the substrate 107 level. The bias RF power applied at the substrate 107 level by the bias RF signal generator 125 is controlled to generate the supplemental plasma density 154 at the substrate 107 level, i.e., just above the substrate 107. Generally, the bias voltage ($V_b$) generated by the RF signals supplied by the bias RF signal generator 125 is inversely proportional to the frequency (f) of these RF signals ($V_b \propto 1/f$). Because the bias RF power ($P_b$) is given by the product of the bias voltage ($V_b$) and the bias current ($I_b$), i.e., ($P_b=V_b*I_b$), when the bias voltage ($V_b$) is lower, the bias current ($I_b$) has to be correspondingly higher to have the same bias RF power ($P_b$). Therefore, to achieve a higher plasma density from a given bias RF power ($P_b$), it is necessary to have a lower bias voltage ($V_b$) and a correspondingly higher bias current ($I_b$). And, because the bias voltage ($V_b$) is inversely proportional to the frequency (f) of the bias RF signals, in order to obtain a lower bias voltage ($V_b$) for a given bias RF power ($P_b$), the frequency (f) of the bias RF signals can be increased. Therefore, to obtain an increase in the supplemental plasma density 154 generated at the substrate 107 level, while simultaneously keeping the bias voltage ($V_b$) low, RF signals of higher frequency (f) can be supplied to the bias electrode 123. And, to obtain an increase in the supplemental plasma density 154 generated at the substrate 107 level, while simultaneously keeping the bias voltage ($V_b$) high, RF signals of lower frequency (f) can be supplied to the bias electrode 123.

Figure 3:
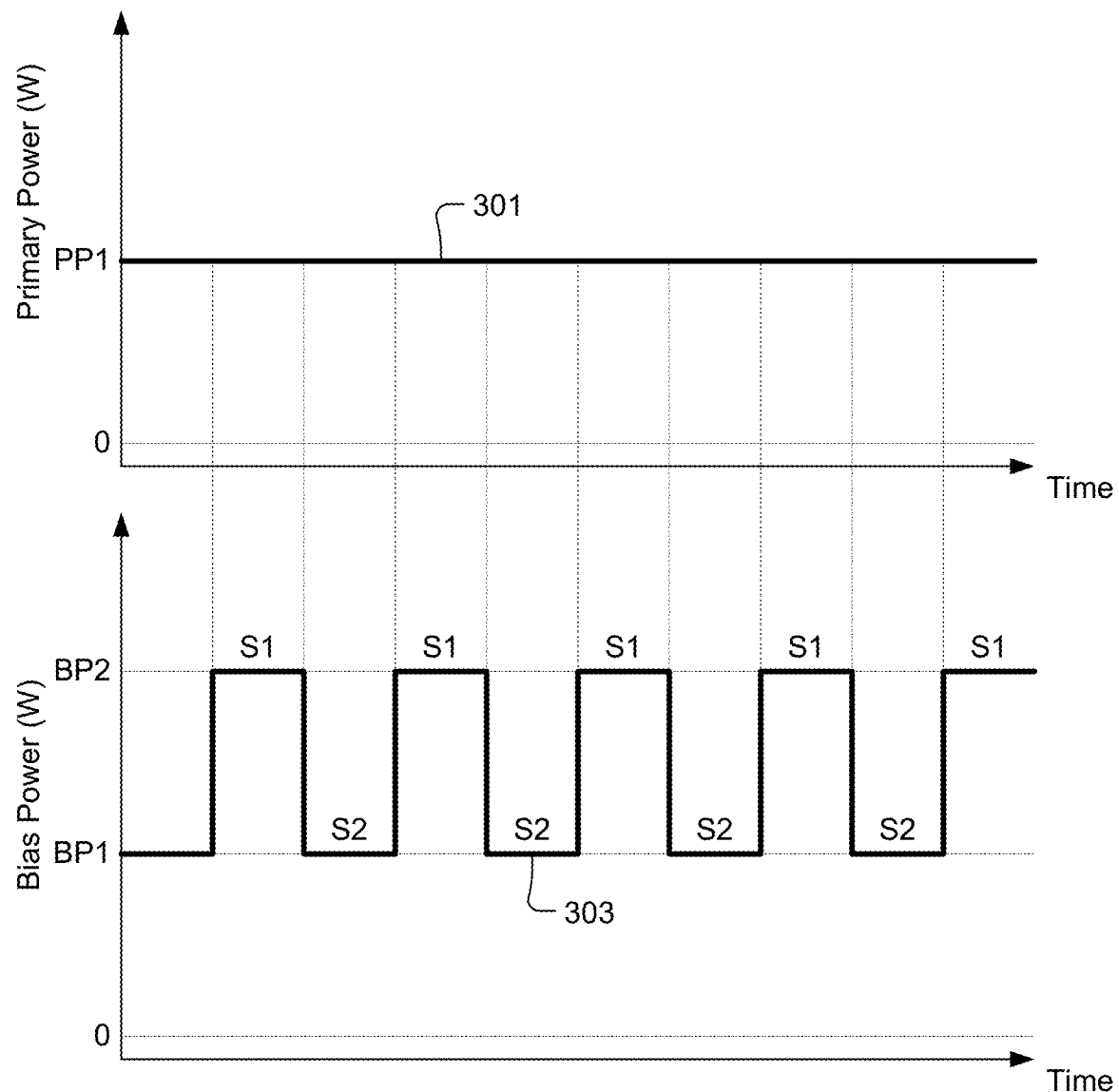
FIG. 3 shows an operational diagram of a multi-level RF power pulsing process in which the bias RF power is pulsed while maintaining a substantially constant primary RF power, in accordance with some embodiments.

In some embodiments, the control system 153 is programmed to direct operation of the primary RF signal generator 137 and/or the bias RF signal generator 125 in accordance with multi-level RF power pulsing process. FIG. 3 shows an operational diagram of a multi-level RF power pulsing process in which the bias RF power is pulsed while maintaining a substantially constant primary RF power, in accordance with some embodiments. The primary RF power supplied from the primary RF signal generator 137 to the coil 101 is held substantially constant at a primary power level (PP1) over a duration of the process, as indicated by the line 301. The bias RF power supplied from the bias RF signal generator 125 to the bias electrode 123 is pulsed between a lower bias power level (BP1) and a higher bias power level (BP2) over the duration of the process, as indicated by the line 303. The higher bias power level (BP2) occurs during a first operational state (S1). The lower bias power level (BP1) occurs during a second operational state (S2). The first operational state (S1) and the second operational state (S2) occur in a cyclical manner (in an alternating and sequential manner) over the duration of the process. In various embodiments, a duration of a given instance of the first operational state (S1) is specified by the operator, and a duration of a given instance of the second operational state (S2) is specified by the operator. In various embodiments, the duration of the given instance of the first operational state (S1) can be either the same as or different than the duration of the given instance of the second operational state (S2). For example, in some embodiments, the duration of the given instance of the first operational state (S1) is substantially equal to the duration of the given instance of the second operational state (S2). Or, in some embodiments, the duration of the given instance of the first operational state (S1) is less than the duration of the given instance of the second operational state (S2). Or, in some embodiments, the duration of the given instance of the first operational state (S1) is greater than the duration of the given instance of the second operational state (S2). Also, the higher bias power level (BP2) and the lower bias power level (BP1) are specified by an operator. Transitioning between the higher bias power level (BP2) and the lower bias power level (BP1), and vice-versa, causes a change in impedance of the plasma. Therefore, it should be understood that for each of the first operational state (S1) and the second operational state (S2), respectively corresponding the higher bias power level (BP2) and the lower bias power level (BP1), the bias RF signal generator 125 has a different optimum operating frequency setpoint. For the first operational state (S1), the bias RF signal generator 125 has a first optimum operating frequency setpoint ($\Gamma_{B1S1}$). And, for the second operational state (S2), the bias RF signal generator 125 has a second optimum operating frequency preset setpoint ($\Gamma_{B1S2}$).

A sum of the duration of one instance of the first operational state (S1) and the duration of one instance of the second operational state (S2) gives a duration of a bias RF power pulse cycle. In some embodiments, the bias RF power is rapidly modulated between the higher bias power level (BP2) and the lower bias power level (BP1). For example, in some embodiments, the duration of a bias RF power pulse cycle is on the order of 100 microseconds. However, in some embodiments, the duration of the bias RF power pulse cycle can be either less than or greater than 100 microseconds. The point is that the duration of the bias RF power pulse cycle is very short, such that very rapid switching occurs between the higher bias power level (BP2) and the lower bias power level (BP1). When the bias RF power level is being changed this rapidly, only one of the first operational state (S1) and the second operational state (S2) can be tuned using the impedance matching system 129 to maximize delivered bias RF power. The other one of the first operational state (S1) and the second operational state (S2) has to be tuned using the frequency of the bias RF signal generator 125 to maximize delivered bias RF power. For example, in some embodiments, the first operational state (S1) (high bias power) is tuned to maximize delivered bias RF power using one or more capacitor setting(s) within the impedance matching system 129, and the second operational state (S2) (low bias power) is tuned to maximize delivered bias RF power, or sustained voltage at the wafer plane, using the frequency setting of the bias RF signal generator 125.

In order to maximize RF power delivery to the plasma in both the first operational state (S1) and the second operational state (S2), the first operating frequency setpoint ($f_{B1S1}$) and the second operating frequency preset setpoint ($f_{B1S2}$) must be set to simultaneously minimize reflected RF power at the output 271 of the bias RF signal generator 125 in both the first operational state (S1) and the second operational state (S2), while also simultaneously minimizing an applied versus setpoint voltage/power difference as measured at the output 271 of the bias RF signal generator 125 in both the first operational state (S1) and the second operational state (S2). Therefore, in the example multi-level bias RF power pulsing process of FIG. 3, a 2D frequency setpoint grid exists for the bias RF signal generator 125, with first operating frequency setpoint ($f_{B1S1}$) on a horizontal axis of the 2D frequency setpoint grid, and with the second operating frequency preset setpoint ($f_{B1S2}$) on a vertical axis of the 2D frequency setpoint grid. An optimum set of setpoint frequency coordinates $\{\Gamma_{B1S1}, \Gamma_{B1S2}\}$ exists within the 2D frequency setpoint grid that includes: 1) an optimal value of the first operating frequency setpoint ($\Gamma_{B1S1}$) to be applied during the first operational state (S1), and 2) an optimal value of the second operating frequency preset setpoint ($\Gamma_{B1S2}$) to be applied during the second operational state (S2). When a person is tasked with tuning the bias RF signal generator 125 for the multi-level RF power pulsing process of FIG. 3, the person must select the optimal set of setpoint frequency coordinates $\{\Gamma_{B1S1}, \Gamma_{B1S2}\}$ that simultaneously satisfy the following optimization conditions:

Minimum reflection coefficient ($\Gamma$) at the output 271 of the bias RF signal generator 125 during the first operational state (S1), Minimum reflection coefficient ($\Gamma$) at the output 271 of the bias RF signal generator 125 during the second operational state (S2), Minimum deviation of voltage/power at the output 271 of the bias RF signal generator 125 from setpoint voltage/power for the first operational state (S1), and Minimum deviation of voltage/power at the output 271 of the bias RF signal generator 125 from setpoint voltage/power for the second operational state (S2).

Figure 4A:
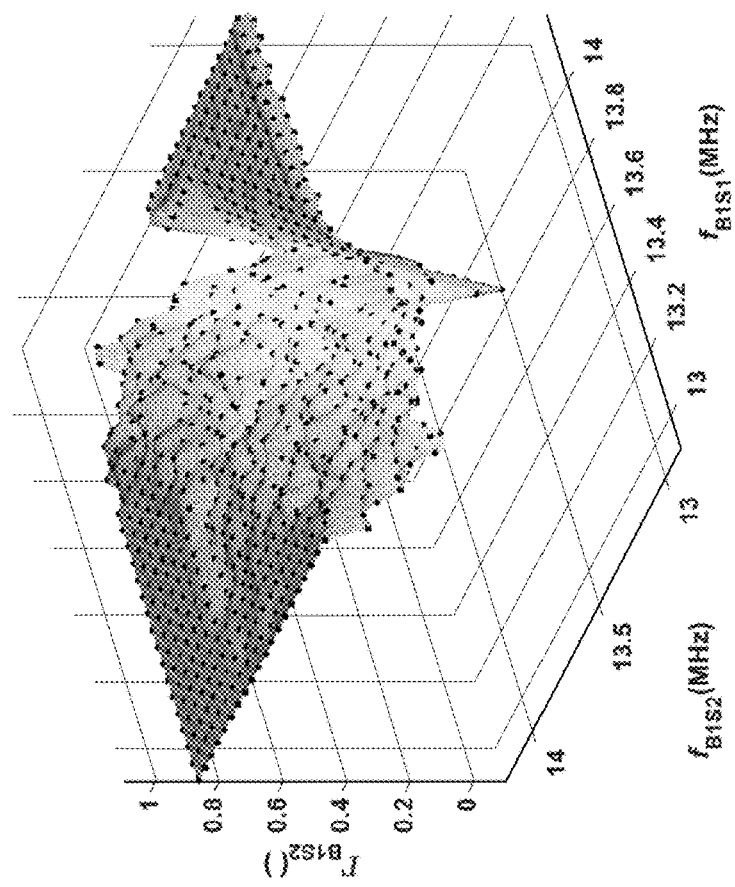
FIG. 4A shows the reflection coefficient ($\Gamma_{B1S1}$) at the output of the bias RF signal generator during the first operational state (S1) across the 2D frequency setpoint grid defined by the first operating frequency setpoint ($f_{B1S1}$) and the second operating frequency preset setpoint ($f_{B1S2}$), for the example multi-level bias RF power pulsing process of FIG. 3, in accordance with some embodiments.
Figure 4B:
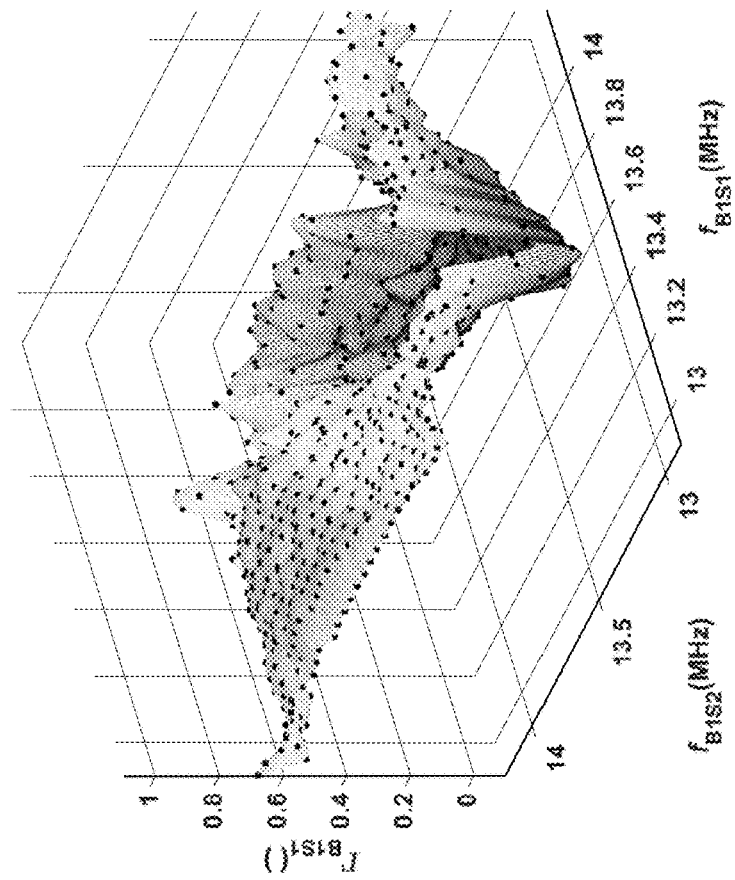
FIG. 4B shows the reflection coefficient ($\Gamma_{B1S2}$) at the output of the bias RF signal generator during the second operational state (S2) across the 2D frequency setpoint grid defined by the first operating frequency setpoint ($f_{B1S1}$) and the second operating frequency preset setpoint ($f_{B1S2}$), for the example multi-level bias RF power pulsing process of FIG. 3, in accordance with some embodiments.

FIG. 4A shows the reflection coefficient ($\Gamma_{B1S1}$) at the output 271 of the bias RF signal generator 125 during the first operational state (S1) across the 2D frequency setpoint grid defined by the first operating frequency setpoint ($f_{B1S1}$) and the second operating frequency preset setpoint ($f_{B1S2}$), for the example multi-level bias RF power pulsing process of FIG. 3, in accordance with some embodiments. FIG. 4B shows the reflection coefficient ($\Gamma_{B1S2}$) at the output 271 of the bias RF signal generator 125 during the second operational state (S2) across the 2D frequency setpoint grid defined by the first operating frequency setpoint ($f_{B1S1}$) and the second operating frequency preset setpoint ($f_{B1S2}$), for the example multi-level bias RF power pulsing process of FIG. 3, in accordance with some embodiments. FIG. 4A shows that with regard to minimizing the reflection coefficient ($\Gamma_{B1S1}$) at the output 271 of the bias RF signal generator 125 during the first operational state (S1), a large number of values are permissible for the optimal set of setpoint frequency coordinates $\{\Gamma_{B1S1}, \Gamma_{B1S2}\}$. However, FIG. 4B shows that with regard to minimizing the reflection coefficient ($\Gamma_{B1S2}$) at the output 271 of the bias RF signal generator 125 during the second operational state (S2), a limited number of values are permissible for the optimal set of setpoint frequency coordinates $\{\Gamma_{B1S1}, \Gamma_{B1S2}\}$.

Figure 5B:
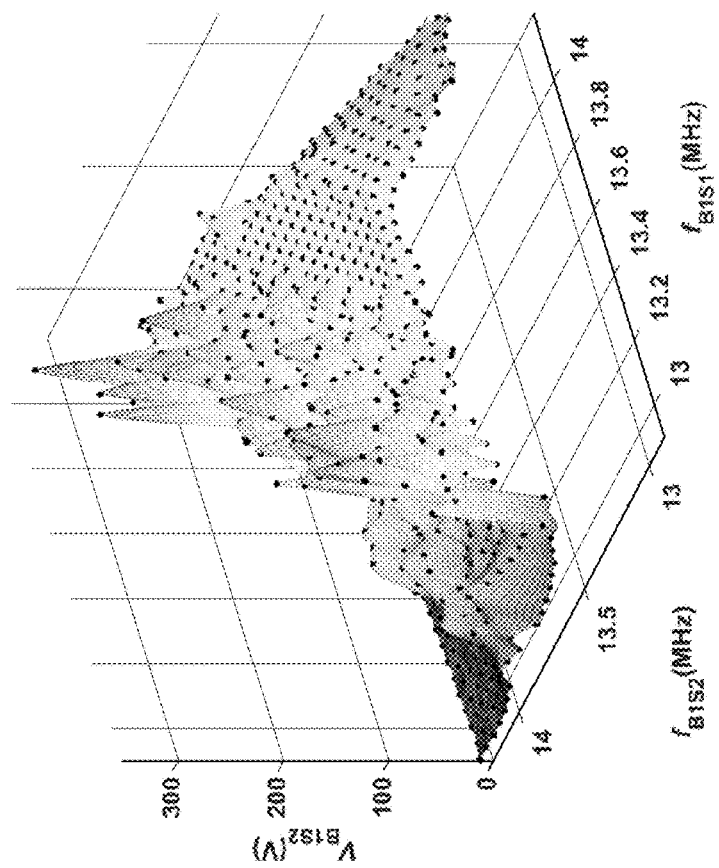
FIG. 5B shows the voltage ($V_{B1S2}$) at the output of the bias RF signal generator during the second operational state (S2) across the 2D frequency setpoint grid defined by the first operating frequency setpoint ($f_{B1S1}$) and the second operating frequency preset setpoint ($f_{B1S2}$), for the example multi-level bias RF power pulsing process of FIG. 3, with a voltage setpoint of 200 V for the second operational state (S2), in accordance with some embodiments.
Figure 5A:
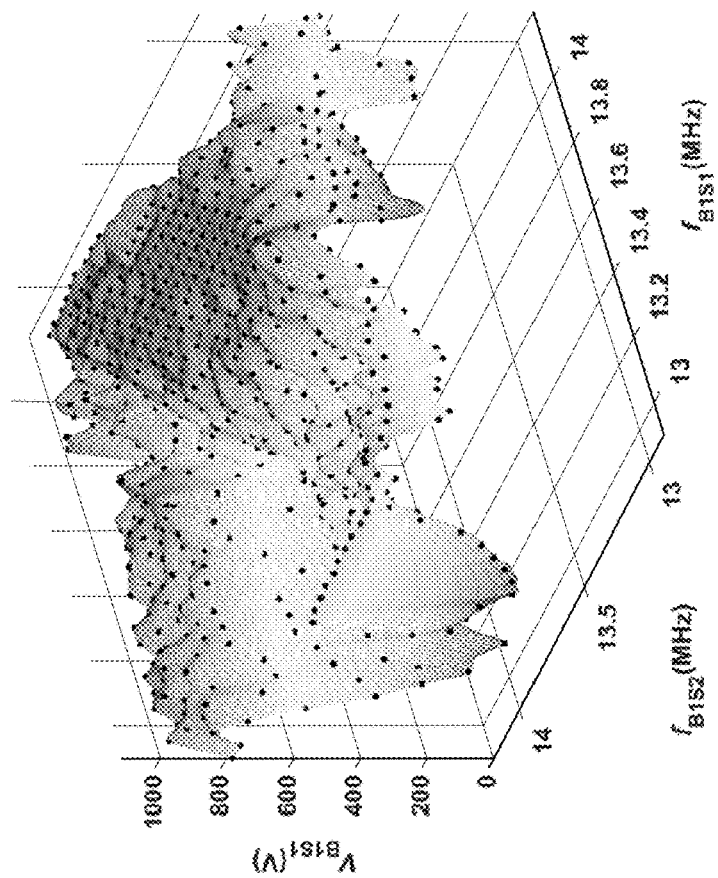
FIG. 5A shows the voltage ($V_{B1S1}$) at the output of the bias RF signal generator during the first operational state (S1) across the 2D frequency setpoint grid defined by the first operating frequency setpoint ($f_{B1S1}$) and the second operating frequency preset setpoint ($f_{B1S2}$), for the example multi-level bias RF power pulsing process of FIG. 3, with a voltage setpoint of 1000 V for the first operational state (S1), in accordance with some embodiments.

FIG. 5A shows the voltage ($V_{B1S1}$) at the output 271 of the bias RF signal generator 125 during the first operational state (S1) across the 2D frequency setpoint grid defined by the first operating frequency setpoint ($f_{B1S1}$) and the second operating frequency preset setpoint ($f_{B1S2}$), for the example multi-level bias RF power pulsing process of FIG. 3, with a voltage setpoint of 1000 V for the first operational state (S1), in accordance with some embodiments. FIG. 5B shows the voltage ($V_{B1S2}$) at the output 271 of the bias RF signal generator 125 during the second operational state (S2) across the 2D frequency setpoint grid defined by the first operating frequency setpoint ($f_{B1S1}$) and the second operating frequency preset setpoint ($f_{B1S2}$), for the example multi-level bias RF power pulsing process of FIG. 3, with a voltage setpoint of 200 V for the second operational state (S2), in accordance with some embodiments. FIG. 5A shows that with regard to minimizing the difference between the voltage setpoint of 1000 V and the actual voltage measured at the output 271 of the bias RF signal generator 125 during the first operational state (S1), a large number of values are permissible for the optimal set of setpoint frequency coordinates $\{\Gamma_{B1S1}, \Gamma_{B1S2}\}$. However, FIG. 5B shows that with regard to minimizing the difference between the voltage setpoint of 200 V and the actual voltage measured at the output 271 of the bias RF signal generator 125 during the second operational state (S2), a limited number of values are permissible for the optimal set of setpoint frequency coordinates $\{\Gamma_{B1S1}, \Gamma_{B1S2}\}$.

Based on the data displayed in FIGS. 4A, 4B, 5A, and 5B, is should be appreciated that it is a complex, iterative, time-consuming, expensive, and error-prone task to manually determine the optimal set of setpoint frequency coordinates $\{\Gamma_{B1S1}, \Gamma_{B1S2}\}$ that simultaneously satisfy the above-mentioned optimization conditions. Also, based on the data displayed in FIGS. 4A, 4B, 5A, and 5B, is should be appreciated that multi-level RF power pulsing processes have a limited number of permissible setpoint frequency coordinates $\{\Gamma_{B1S1}, \Gamma_{B1S2}\}$ that satisfy the above-mentioned optimization conditions. This is due to the interactions between the first operational state (S1) and the second operational state (S2) of the bias RF signal generator 125 that limit the number of permissible combinations of preset operating frequencies $\{\Gamma_{B1S1}, \Gamma_{B1S2}\}$.

Prior technology does not provide an automated process for determining the optimal set of setpoint frequency coordinates $\{\Gamma_{B1S1}, \Gamma_{B1S2}\}$ that simultaneously satisfy the above-mentioned optimization conditions. Therefore, in the absence of the automated frequency tuner disclosed herein, identifying or selecting the correct preset frequencies $\{\Gamma_{B1S1}, \Gamma_{B1S2}\}$ for the first operational state (S1) and the second operational state (S2) of the multi-level RF power pulsing process of FIG. 3 was previously done by having an RF specialist/engineer manually perform a series of frequency scans and subsequently select the appropriate preset frequency after each scan. This prior manual frequency scan procedure could take up to 20 minutes per process step when considering the time required to create each frequency scan recipe.

The automated frequency tuning method and corresponding systems disclosed herein obviate the need to perform a manual frequency scan procedure in an attempt to identify the optimal set of setpoint frequency coordinates $\{\Gamma_{B1S1}, \Gamma_{B1S2}\}$ that simultaneously satisfy the above-mentioned optimization conditions. In the automated frequency tuning method, the optimal set of setpoint frequency coordinates $\{\Gamma_{B1S1}, \Gamma_{B1S2}\}$ corresponds to a minimum achievable value of a cost function (J), as shown in Equation 1.

$$J(f_{B1S1}, f_{B1S2}) = \frac{|\overline{V_{B1S1}} - V_{B1S1\_setpoint}|}{V_{B1S1\_setpoint}} + \frac{|\overline{V_{B1S2}} - V_{B1S2\_setpoint}|}{V_{B1S2\_setpoint}} + \overline{\Gamma_{B1S1}} + \overline{\Gamma_{B1S2}}. \quad \text{Equation 1}$$

The cost function (J) of Equation 1 considers the quantities of the average reflection coefficient ($\overline{\Gamma_{B1S1}}$) for the first operation state (S1) over a period of time (which indicates reflected RF power), the average reflection coefficient ($\overline{\Gamma_{B1S2}}$) for the second operation state (S2) over the period of time (which indicates reflected RF power), the deviation of the applied (as-measured) voltage/power ($\overline{V_{B1S1}}$) from the setpoint voltage/power ($V_{B1S1\_setpoint}$) for the first operational state (S1) over the period of time, and the deviation of the applied (as-measured) voltage/power ($\overline{V_{B1S2}}$) from the setpoint voltage/power ($V_{B1S2\_setpoint}$) for the second operational state (S2) over the period of time. The term ($|\overline{V_{B1S1}} - V_{B1S1\_setpoint}|/V_{B1S1\_setpoint}$) in the cost function (J) is an average of a relative error in voltage generated by the bias RF signal generator 125 at the wafer plane in the first operational state (S1) over the period of time. The term ($|\overline{V_{B1S2}} - V_{B1S2\_setpoint}|/V_{B1S2\_setpoint}$) in the cost function (J) is an average of a relative error in voltage generated by the bias RF signal generator 125 at the wafer plane in the second operational state (S2) over the period of time. In some embodiments, Equation 1 can be modified to have the average VSWR ($\overline{VSWR_{B1S1}}$) for the first operational state (S1) over the period of time substituted for the average reflection coefficient ($\overline{\Gamma_{B1S1}}$) for the first operation state (S1) over the period of time, and/or to have the average VSWR ($\overline{VSWR_{B1S2}}$) for the second operational state (S2) over the period of time substituted for the average reflection coefficient ($\overline{\Gamma_{B1S2}}$) for the second operation state (S2) over the period of time.

The cost function (J) of Equation 1 can be evaluated at any point on the 2D frequency setpoint grid defined by the first operating frequency setpoint ($f_{B1S1}$) and the second operating frequency preset setpoint ($f_{B1S2}$) by performing a plasma processing recipe step as follows:

Operating the primary RF signal generator 137 to generate the plasma 105.

Setting the high power/voltage state (BP2) of the bias RF signal generator 125 (e.g., the first operational state (S1) in the example of FIG. 3) in the Match Cap tuning mode, Setting the low power/voltage state (BP1) of the bias RF signal generator 125 (e.g., the second operational state (S2) in the example of FIG. 3) in Manual tuning mode, Setting the preset frequency ($F_{B1S1}$) of the bias RF signal generator 125 for the first operational state (S1) to the desired value, Setting the preset frequency ($F_{B1S2}$) of the bias RF signal generator 125 for the second operational state (S2) to the desired value, Running the plasma processing recipe step for about 5 seconds on a test wafer having a target material film deposited thereon, or until it is possible to measure the following at the output 271 of the bias RF signal generator 125: the average reflection coefficient ($\overline{\Gamma_{B1S1}}$) for the first operational state (S1), the average reflection coefficient ($\overline{\Gamma_{B1S2}}$) for the second operational state (S2), the average voltage/power ($\overline{V_{B1S1}}$) for the first operational state (S1), and the average voltage/power ($\overline{V_{B1S2}}$) for the second operational state (S2), and Computing the cost function (J) as shown in Equation 1 for the set of frequency coordinates $\{F'_{B1S1}, F'_{B1S2}\}$.

Figure 6A:
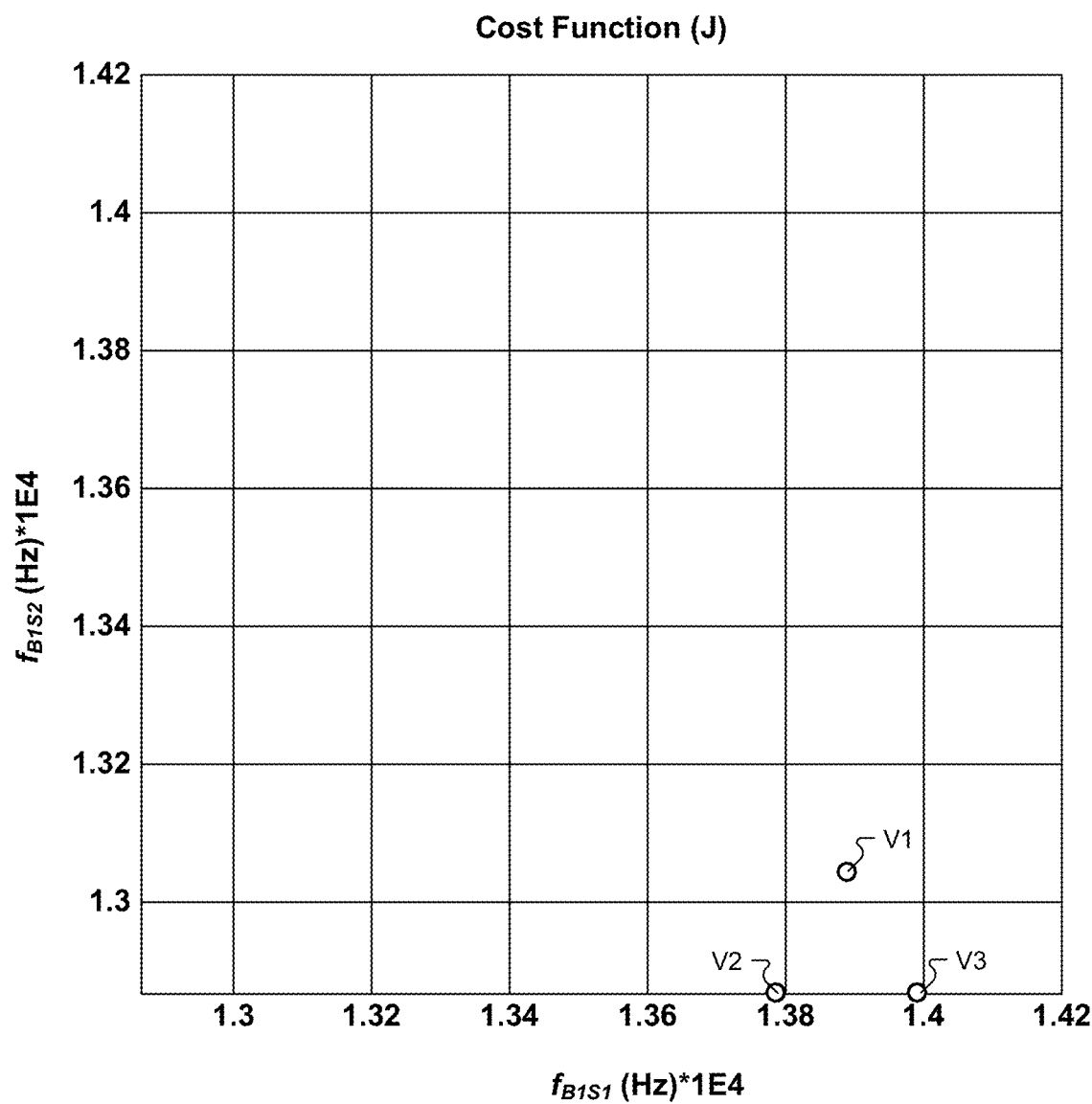
FIG. 6A shows the 2D frequency search grid with an initial equilateral triangle defined by vertices V1, V2, and V3, placed in the lower right quadrant of the 2D frequency search grid, in accordance with some embodiments.

The average values of reflection coefficients and the voltage/power for the cost function (J) are obtained from the RF generator data logger by excluding the transient part of the step to obtain the steady state values. The cost function (J) is minimized through carefully-placed and systematic evaluations of the cost function (J) on the 2D frequency setpoint grid in accordance with a triangulation search algorithm. For this reason, the 2D frequency setpoint grid is also referred to as the 2D frequency search grid. The triangulation search algorithm begins by placing an equilateral triangle of side length (L) in the lower right quadrant of the 2D frequency search grid. FIG. 6A shows the 2D frequency search grid with an initial equilateral triangle defined by vertices V1, V2, and V3, placed in the lower right quadrant of the 2D frequency search grid, in accordance with some embodiments. The position of the initial equilateral triangle in the lower right quadrant is selected based on experiential knowledge that the lower right quadrant of the 2D frequency search grid is expected to contain the optimum set of setpoint frequency coordinates $\{\Gamma_{B1S1}, \Gamma_{B1S2}\}$. In this example embodiment, in order for the triangulation search algorithm to move sufficiently rapidly through the 2D frequency search grid, the initial side length (L) of the equilateral triangle is set to 200 kHz. It should be understood, however, that in other embodiments, the initial side length (L) of the equilateral triangle can be set at a value other than 200 kHz.

Once the initial equilateral triangle is placed, the cost function (J) is evaluated at all three vertices V1, V2, and V3 of the equilateral triangle. Evaluation of the cost function (J) at a given vertex (i.e., at a given set of frequency coordinates $\{f_{B1S1}, f_{B1S2}\}$) within the 2D frequency search grid is done by performing the plasma processing recipe step as described above on a test wafer that has a blanket film of a target material exposed to the plasma, such as a blanket film of a target material to be etched. After the cost function (J) is evaluated at all three vertices V1, V2, and V3, the values of the cost function (J) for the three vertices V1, V2, and V3 are compared to identify the vertex that has the largest value of the cost function (J). The vertex that is identified as having the largest value of the cost function (J) is designated as the moving vertex.

Figure 6B:
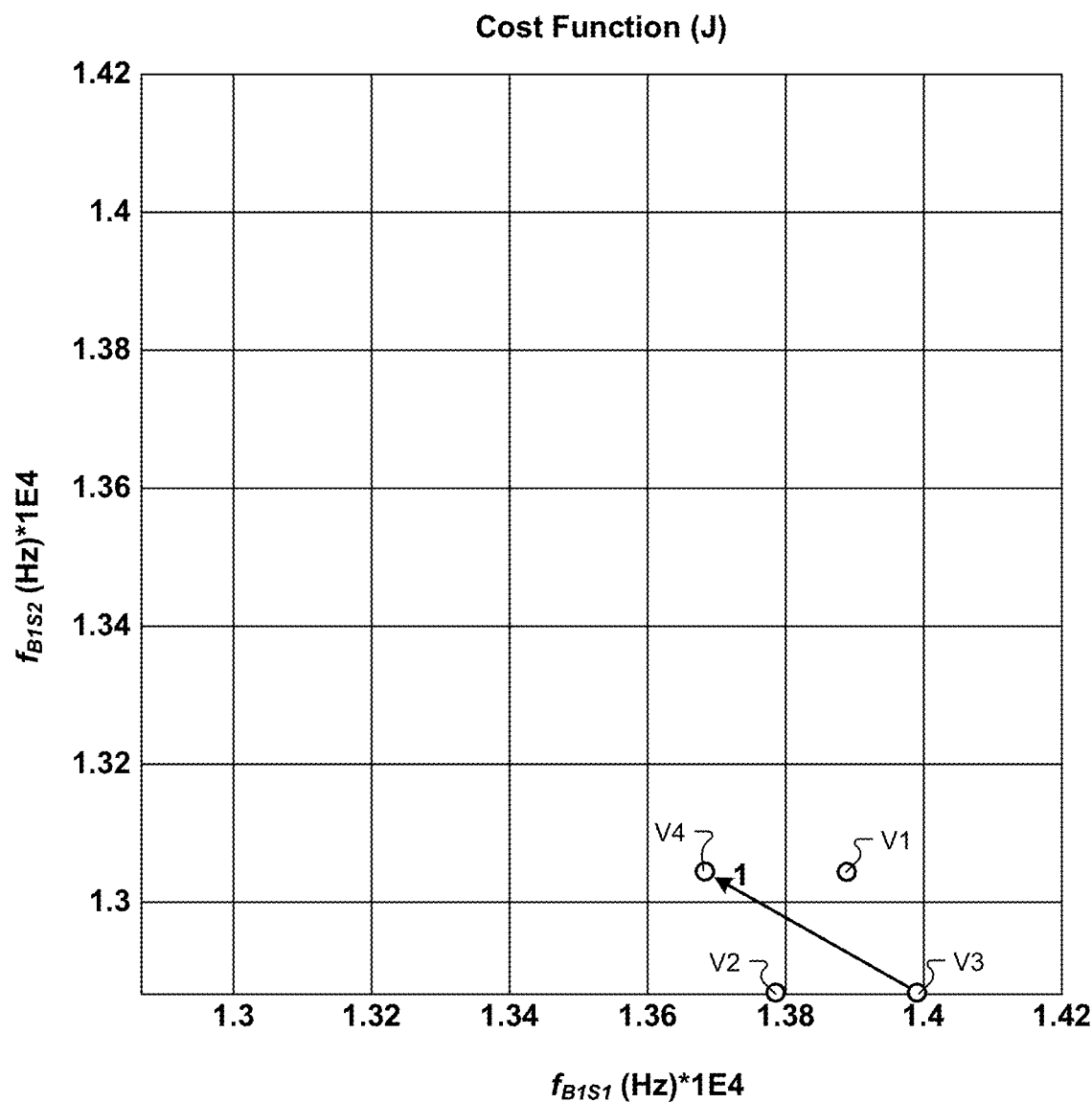
FIG. 6B shows the 2D frequency search grid with the moving vertex V3 moving through the centroid of the current equilateral triangle to form a new vertex V4 of the new equilateral triangle, in accordance with some embodiments.

Once the moving vertex is determined for the current equilateral triangle, the moving vertex is geometrically moved within the 2D frequency search grid in a straight line from its current position through a centroid of the current equilateral triangle until the moving vertex is at a location that forms a new equilateral triangle with the other two (non-moving) vertices of the current equilateral triangle, or in other words until the moving vertex is the side length (L) away from the other two (non-moving) vertices of the current equilateral triangle. In the example of FIG. 6A, the vertex V3 is determined to have the largest value of the cost function (J). Therefore, the vertex V3 is designated as the moving vertex. FIG. 6B shows the 2D frequency search grid with the moving vertex V3 moving through the centroid of the current equilateral triangle to form a new vertex V4 of a new equilateral triangle. Now, the new equilateral triangle formed by the vertices V1, V2, and V4 is considered the current equilateral triangle. The triangulation search algorithm prevents moving a vertex outside of the 2D frequency search grid.

Figure 6C:
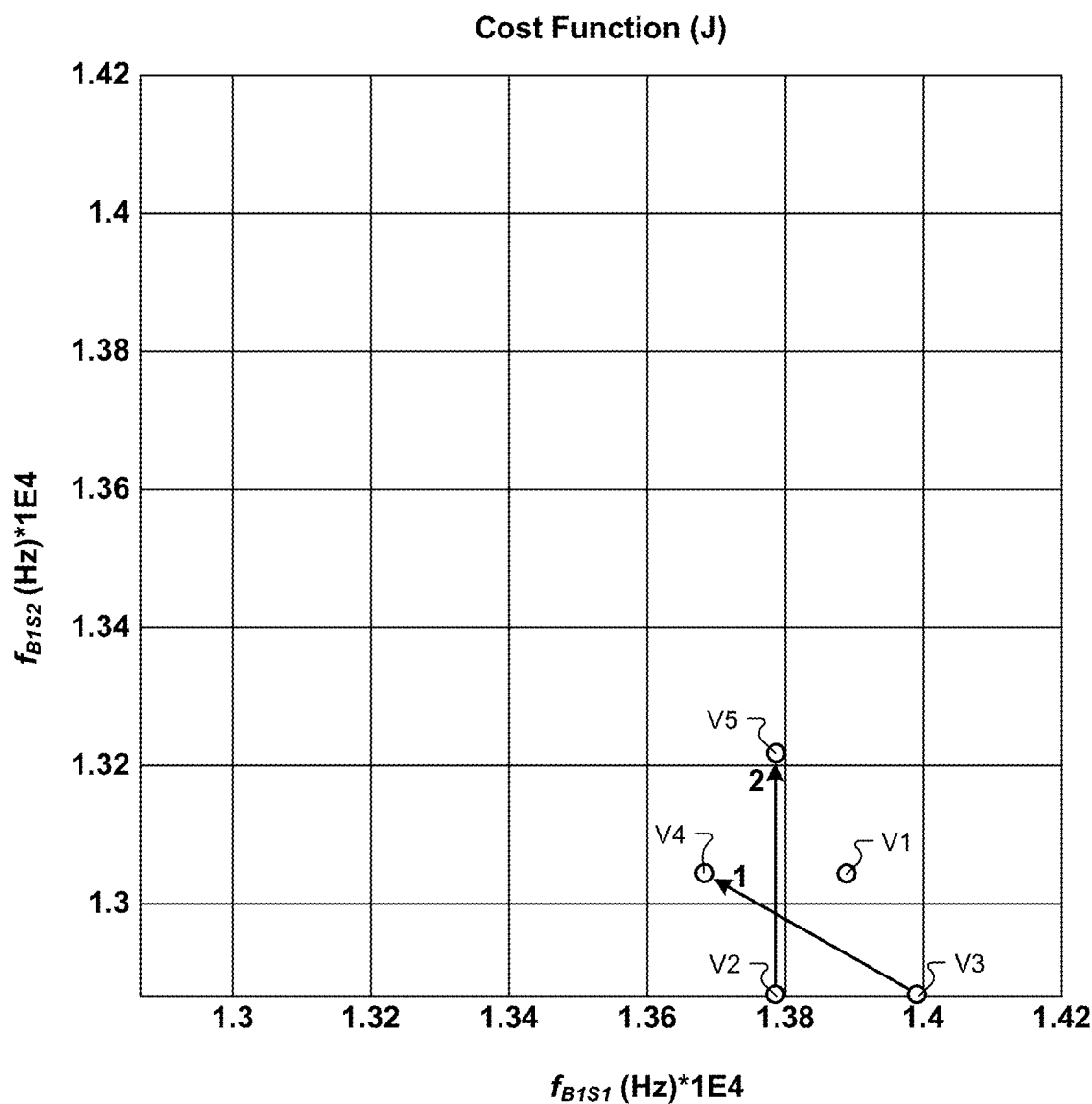
FIG. 6C shows the 2D frequency search grid with the moving vertex V2 moving through the centroid of the current equilateral triangle to form a new vertex V5 of a new equilateral triangle, in accordance with some embodiments.

The cost function (J) is then evaluated at the new vertex V4. Then, values of the cost function (J) for the three vertices V1, V2, and V4 of the current equilateral triangle are compared to identify the vertex that has the largest value of the cost function (J). The vertex that is identified as having the largest value of the cost function (J) is designated as the next moving vertex. In the example of FIG. 6B, the vertex V2 is determined to have the largest value of the cost function (J). Therefore, the vertex V2 is designated as the next moving vertex. FIG. 6C shows the 2D frequency search grid with the moving vertex V2 moving through the centroid of the current equilateral triangle to form a new vertex V5 of a new equilateral triangle. Now, the new equilateral triangle formed by the vertices V1, V4, and V5 is considered the current equilateral triangle. The cost function (J) for the new vertex V5 is evaluated. Then, the cost function (J) values for the vertices V1, V4, and V5 of the current equilateral triangle are compared to determine the next moving vertex as the vertex that has the largest value of the cost function (J).

Figure 6D:
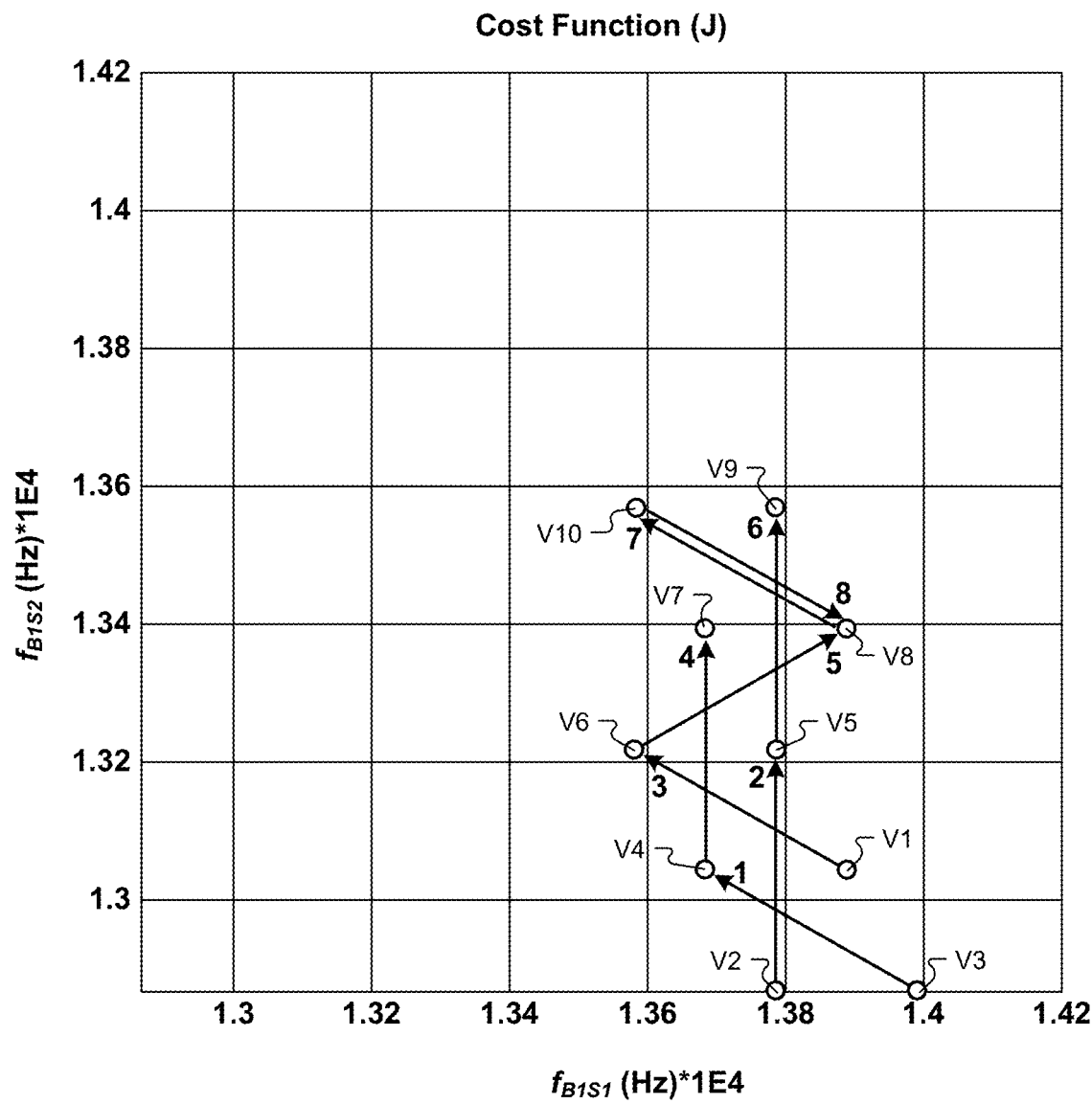
FIG. 6D shows an advancement of the triangulation search algorithm from FIG. 6C up to the point where a moving vertex V10 moves back to its previous position corresponding to vertex V8, in accordance with some embodiments.

The process of evaluating the cost function (J) at the three vertices of the current equilateral triangle, and comparing the values of the cost function (J) for the three vertices of the currently equilateral triangle to determine the next moving vertex, and moving the next moving vertex to form the new equilateral triangle is repeated until the moving vertex moves back to a previously occupied vertex position with the 2D frequency search grid. FIG. 6D shows an advancement of the triangulation search algorithm from FIG. 6C up to the point where a moving vertex V10 moves back to a previously occupied vertex position corresponding to vertex V8. At this point, the minimum value of the cost function (J) is located within an area encompassed by the set of repeated frequency coordinates corresponding to the vertices V8 and V10.

Figure 6E:
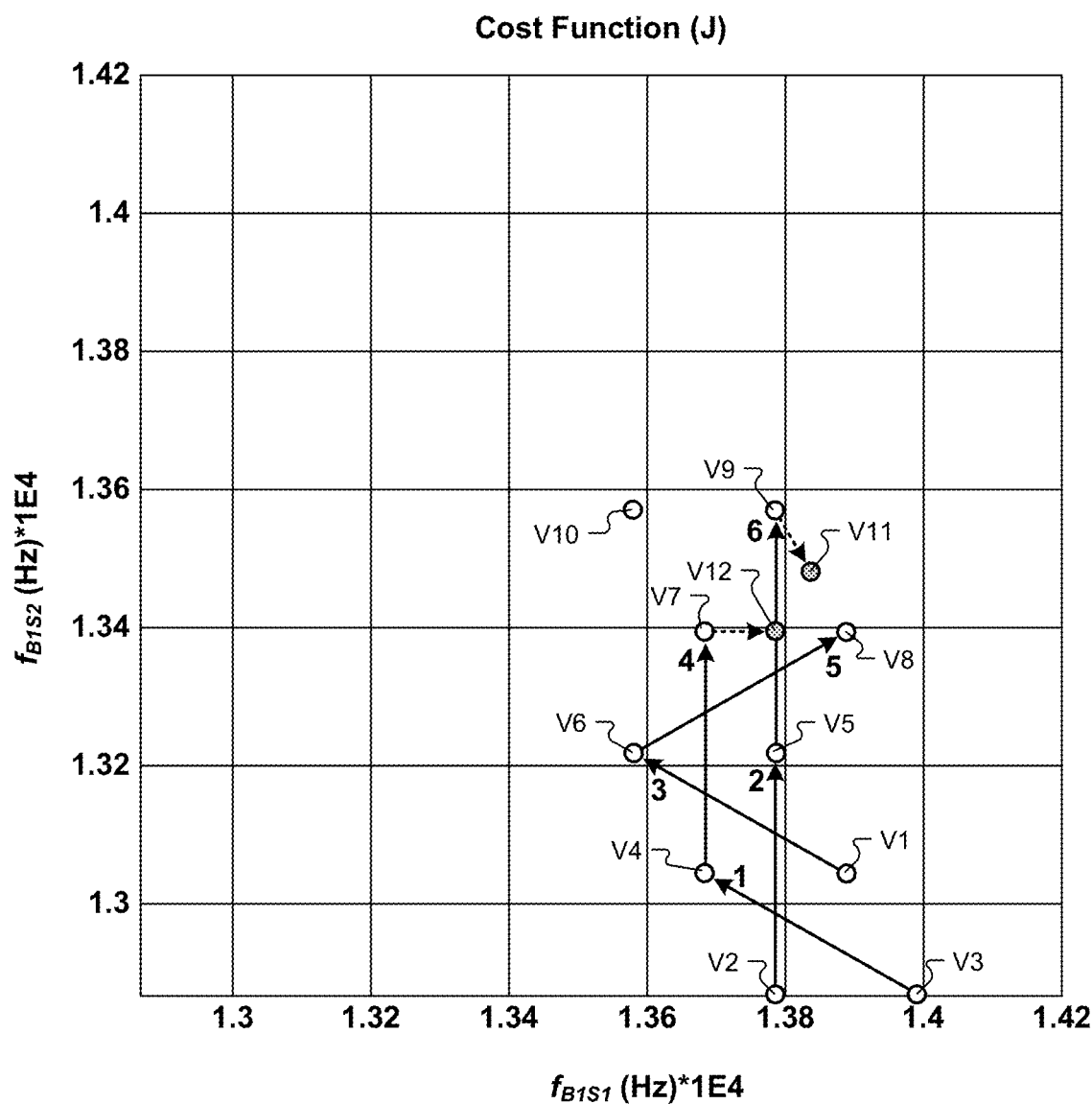
FIG. 6E shows the reduction of the size of the equilateral triangle after the vertex V10 moves back to its previous position corresponding to vertex V8, in accordance with some embodiments.

When the moving vertex is found to repeat its previous position within the 2D frequency search grid, the size of the equilateral triangle is reduced by reducing the current side length (L) size by one-half. So, after the most recent moving vertex is moved so as to occupy its previous position within the 2D frequency search grid, that previous position within the 2D frequency search grid is an anchor position for reduction of the size of the equilateral triangle. With the anchor position set, the other two vertices of the most recently formed equilateral triangle are respectively moved in straight lines toward the anchor position to form a new equilateral triangle having a side length (L) that is one-half of the size of the side-length (L) of the previous equilateral triangle. FIG. 6E shows the reduction of the size of the equilateral triangle after the vertex V10 moves back to its previous position corresponding to vertex V8. The vertex V8 is set as the anchor position for the equilateral triangle size reduction. To reduce the size of the equilateral triangle, the vertex V6 is moved in a straight line toward the vertex V8 until the straight-line distance between the vertexes V6 and V8 is one-half of the previous equilateral triangle side length (L), so as to form a new vertex V11. Also, the vertex V7 is moved in a straight line toward the vertex V8 until the straight-line distance between the vertexes V7 and V8 is one-half of the previous equilateral triangle side length (L), so as to form a new vertex V12. Now, the vertices V8, V11, and V12 form the new equilateral triangle for continuation of the triangulation search algorithm.

Once the size of the equilateral triangle is reduced, the triangulation search algorithm continues the repeated process of evaluating the cost function (J) at the three vertices of the current equilateral triangle, and comparing the values of the cost function (J) for the three vertices of the currently equilateral triangle to determine the next moving vertex, and then moving the next moving vertex to form the new equilateral triangle until the moving vertex moves back to its previous position with the 2D frequency search grid, in the same manner as described with regard to FIGS. 6A through 6D. Then, at this point, another reduction in size of the equilateral triangle is done in the same manner as described with regard to FIG. 6E. The process of moving vertices to create new equilateral triangles within the 2D frequency search grid and reducing the size of equilateral triangle, as described in FIGS. 6A through 6E, continues until a set of minimum cost function (J) convergence criteria are satisfied.

When certain criteria for minimum cost function (J) convergence are met, the final optimal set of setpoint frequency coordinates $\{\Gamma_{B1S1}, \Gamma_{B1S2}\}$ are the frequencies that define the centroid of the final equilateral triangle in the triangulation search algorithm. In some embodiments, the minimum cost function (J) convergence criteria include the following:
- The cost function (J) can no longer be appreciably minimized and does not oscillate.
- The equilateral triangle's side length (L) can no longer be appreciably decreased.
- The frequency coordinates of the moving vertex in the 2D frequency search grid can no longer be appreciably changed and do not oscillate.

Figure 7A:
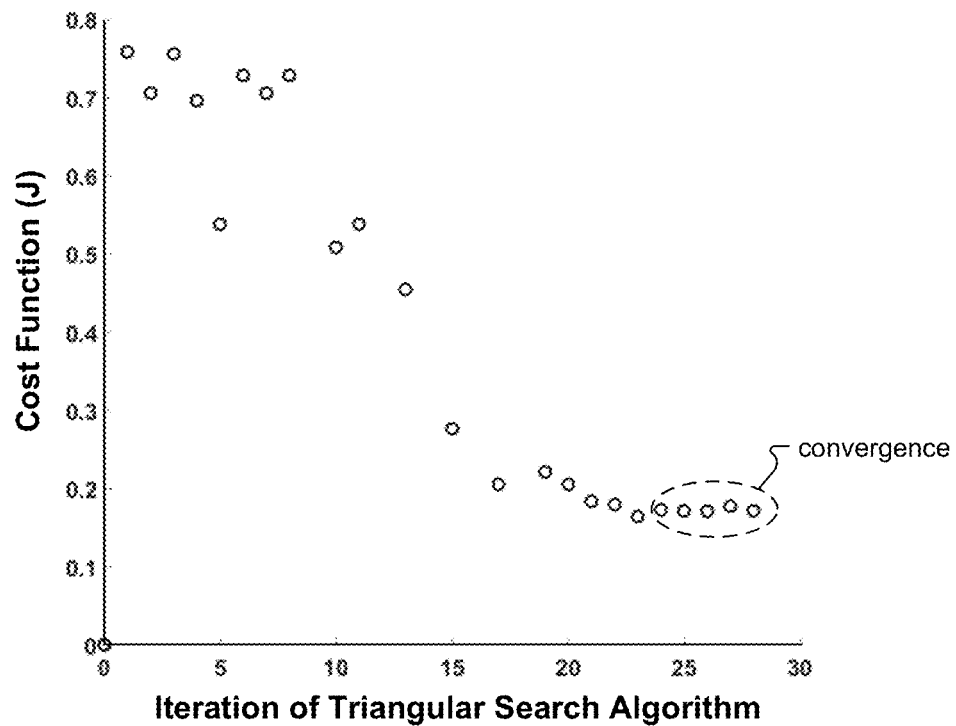
FIG. 7A shows a plot of the cost function (J) evaluated for each new vertex of the equilateral triangles defined across the iterations of the triangulation search algorithm to demonstrate the minimum cost function (J) convergence criteria for when the cost function (J) can no longer be appreciably minimized and does not oscillate, in accordance with some embodiments.

FIG. 7A shows a plot of the cost function (J) evaluated for each new vertex of the equilateral triangles defined across the iterations of the triangulation search algorithm to demonstrate the minimum cost function (J) convergence criteria for when the cost function (J) can no longer be appreciably minimized and does not oscillate, in accordance with some embodiments. Oscillation of the cost function (J) refers to the value of the cost function (J) moving in a repeating pattern as iterations of the triangulation search algorithm continue to be performed. In some embodiments, the cost function (J) can no longer be appreciably minimized when a change of less than or equal to about 5% in the cost function values evaluated for sequential positions of the moving vertex within the two-dimensional frequency search grid exists.

Figure 7B:
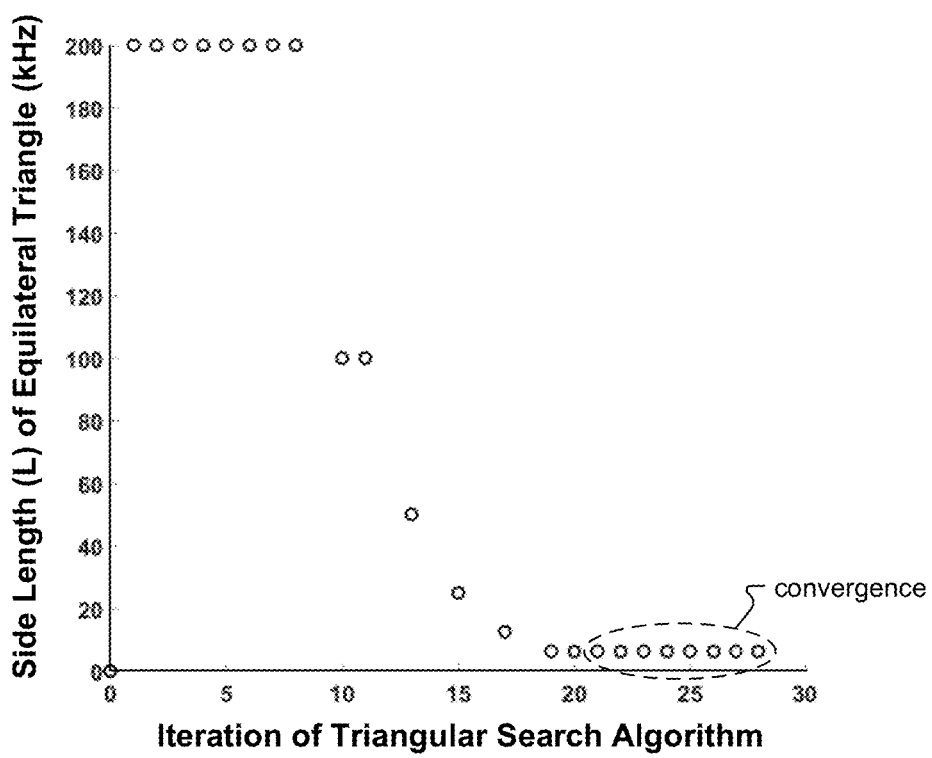
FIG. 7B shows a plot of the equilateral triangle side length across the iterations of the triangulation search algorithm to demonstrate the minimum cost function (J) convergence criteria for when the equilateral triangle's side length can no longer be appreciably decreased, in accordance with some embodiments.

FIG. 7B shows a plot of the equilateral triangle side length across the iterations of the triangulation search algorithm to demonstrate the minimum cost function (J) convergence criteria for when the equilateral triangle's side length can no longer be appreciably decreased, in accordance with some embodiments. In some embodiments, the equilateral triangle's side length can no longer be appreciably decreased when the new equilateral triangle formed during the triangulation search algorithm has a side length of less than or equal to about 5 kiloHertz within the two-dimensional frequency search grid.

Figure 7C:
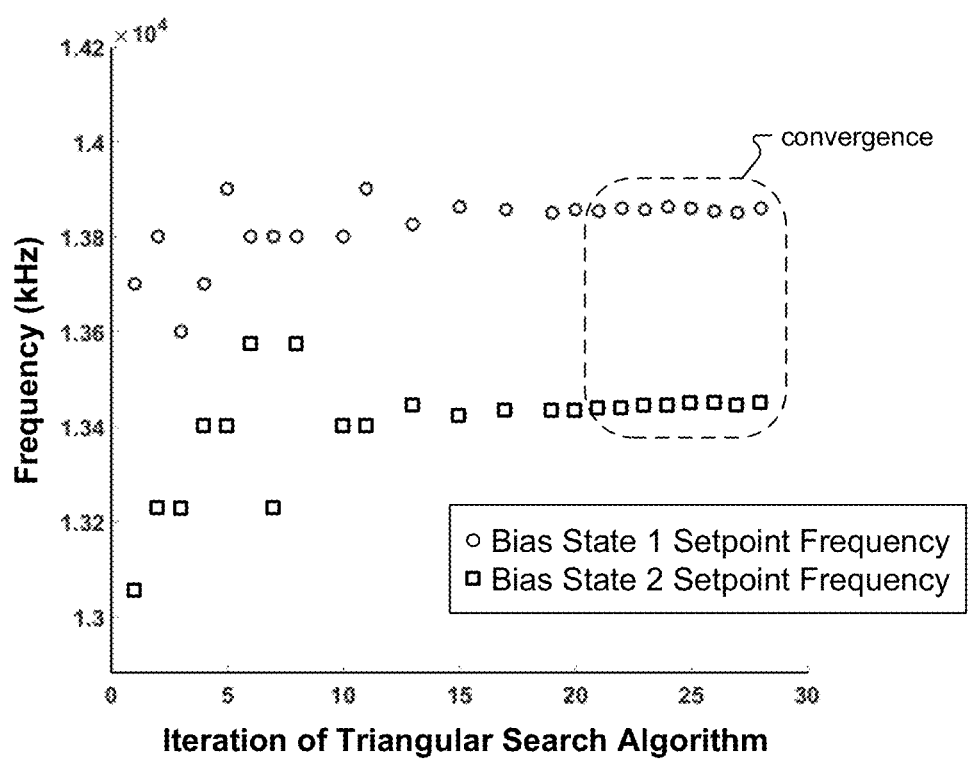
FIG. 7C shows a plot of the frequency coordinates of the moving vertex in the 2D frequency search grid across the iterations of the triangulation search algorithm to demonstrate the minimum cost function (J) convergence criteria for when the frequency coordinates of the moving vertex in the 2D frequency search grid can no longer be appreciably changed and do not oscillate, in accordance with some embodiments.

FIG. 7C shows a plot of the frequency coordinates of the moving vertex in the 2D frequency search grid across the iterations of the triangulation search algorithm to demonstrate the minimum cost function (J) convergence criteria for when the frequency coordinates of the moving vertex in the 2D frequency search grid can no longer be appreciably changed and do not oscillate, in accordance with some embodiments. Oscillation of the frequency coordinates of the moving vertex refers to a position of the moving vertex moving in a repeating pattern within the 2D frequency search grid as iterations of the triangulation search algorithm continue to be performed. If oscillations in the values of the moved vertex coordinates are detected, the triangulation search algorithm is stopped and restarted using a different set of vertices for the initial equilateral triangle. In some embodiments, the frequency coordinates of the moving vertex in the 2D frequency search grid can no longer be appreciably changed when the change in position of the moving vertex is less than or equal to about 1 kiloHertz in each frequency coordinate dimension of the two-dimensional frequency search grid.

Figure 8:
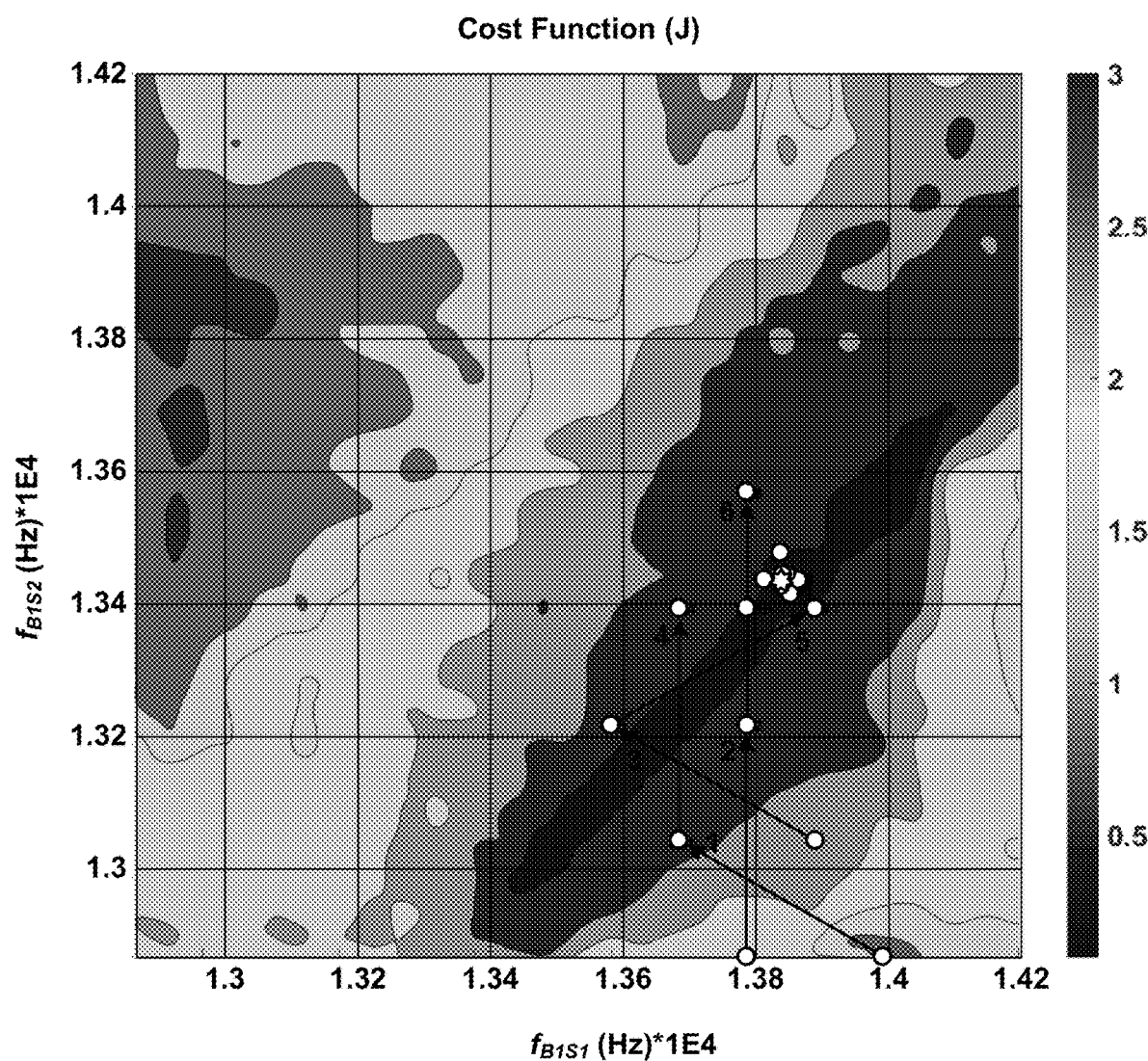
FIG. 8 shows isocontours of the cost function (J) evaluated across the 2D frequency search grid and the steps of the triangulation search algorithm of FIGS. 6A through 6E taken to completion to reach the optimal set of setpoint frequency coordinates $\{\Gamma_{B1S1}, \Gamma_{B1S2}\}$, in accordance with some embodiments.

FIG. 8 shows isocontours of the cost function (J) evaluated across the 2D frequency search grid and the steps of the triangulation search algorithm of FIGS. 6A through 6E taken to completion to reach the final optimal set of setpoint frequency coordinates $\{\Gamma_{B1S1}, \Gamma_{B1S2}\}$, in accordance with some embodiments. It should be understood that the final optimal set of setpoint frequency coordinates $\{\Gamma_{B1S1}, \Gamma_{B1S2}\}$ represent the output of the automated frequency tuning method. The triangulation search algorithm usually takes about 10 to 20 iterations to satisfy the minimum cost function (J) convergence criteria. Each iteration, i.e., each evaluation of the cost function (J) for a new vertex, takes about 5 seconds to perform. Therefore, the triangulation search algorithm usually takes about 3 to 4 minutes to perform, which is much less than the 20 to 30 minutes needed for the manual frequency scan procedure. Also, the optimal set of setpoint frequency coordinates $\{\Gamma_{B1S1}, \Gamma_{B1S2}\}$ is much more reliable than the setpoint frequency coordinates determined by the manual frequency scan procedure. It should be appreciated that because the triangulation search algorithm searches the 2D frequency search grid for the minimum cost function (J) in a systematic and optimization-directed manner, use of the triangulation search algorithm avoid the time and expense of having to generate the complete data sets depicted in FIGS. 4A, 4B, 5A, and 5B.

While the foregoing discussion of the automated frequency tuning method was described within the context of FIG. 3 in which the primary RF power was held substantially constant with the bias RF power level pulsing between the low bias power level (BP1) and the high bias power level (BP2), it should be understood that the automated frequency tuning method disclosed herein is not so limited. For example, the automated frequency tuning algorithm disclosed herein can be used in processes in which both the primary RF power and the bias RF power pulses between different power levels, respectively, with the automated frequency tuning method being applied to determine an optimal set of setpoint frequency coordinates $\{\Gamma_{P1S1}, \Gamma_{P1S2}\}$ for the primary RF signal generator 137, and with the automated frequency tuning method being applied to determine an optimal set of setpoint frequency coordinates $\{\Gamma_{B1S1}, \Gamma_{B1S2}\}$ for the bias RF signal generator 125.

Figure 9:
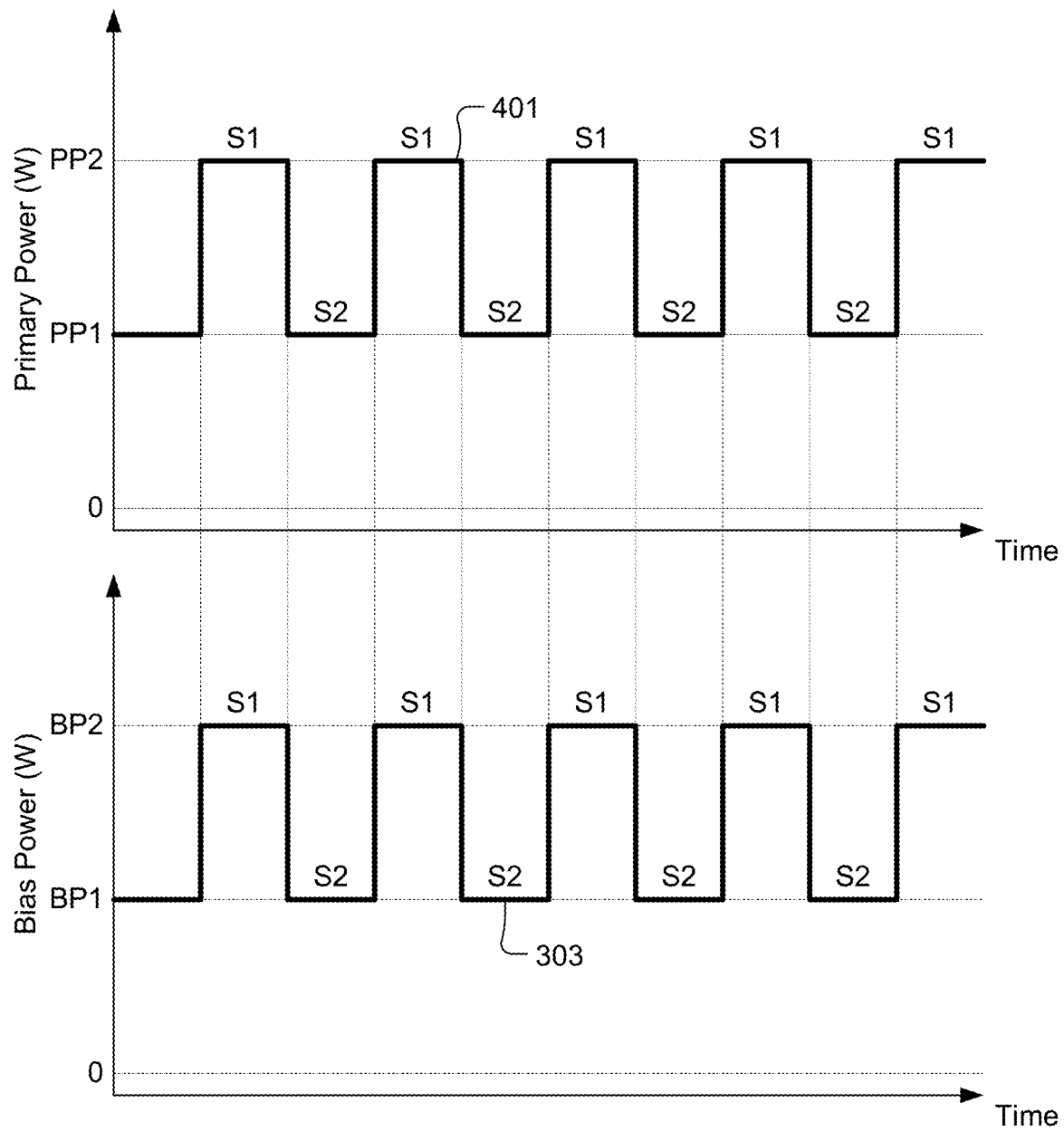
FIG. 9 shows an operational diagram of a multi-level RF power pulsing process in which both the bias RF power and the primary RF power are pulsed in a synchronous manner, in accordance with some embodiments.

FIG. 9 shows an operational diagram of a multi-level RF power pulsing process in which both the bias RF power and the primary RF power are pulsed in a synchronous manner, in accordance with some embodiments. The bias RF power is pulsed as described with regard to FIG. 3. The primary RF power supplied from the primary RF signal generator 137 to the coil 101 is pulsed between a lower primary power level (PP1) and a higher primary power level (PP2) over the duration of the process, as indicated by the line 401. The higher primary power level (PP2) occurs during the first operational state (S1). The lower primary power level (PP1) occurs during the second operational state (S2). The first operational state (S1) and the second operational state (S2) are the same as described with regard to FIG. 3. The higher primary power level (PP2) and the lower primary power level (PP1) are specified by the operator. Transitioning between the higher primary power level (PP2) and the lower primary power level (PP1), and vice-versa, causes a change in impedance of the plasma. Therefore, it should be understood that for each of the first operational state (S1) and the second operational state (S2), respectively corresponding the higher primary power level (PP2) and the lower primary power level (PP1), the primary RF signal generator 137 has a different optimum operating frequency setpoint. For the first operational state (S1), the primary RF signal generator 137 has a first optimum operating frequency setpoint ($\Gamma_{P1S1}$). And, for the second operational state (S2), the primary RF signal generator 137 has a second optimum operating frequency preset setpoint ($F_{P1S2}$).

A sum of the duration of one instance of the first operational state (S1) and the duration of one instance of the second operational state (S2) gives a duration of a primary RF power pulse cycle. In some embodiments, the primary RF power is rapidly modulated between the higher primary power level (PP2) and the lower primary power level (PP1). For example, in some embodiments, the duration of a primary RF power pulse cycle is on the order of 100 microseconds. However, in some embodiments, the duration of the primary RF power pulse cycle can be either less than or greater than 100 microseconds. The point is that the duration of the primary RF power pulse cycle is very short, such that very rapid switching occurs between the higher primary power level (PP2) and the lower primary power level (PP1). When the primary RF power level is being changed this rapidly, only one of the first operational state (S1) and the second operational state (S2) can be tuned using the impedance matching system 141 to maximize delivered primary RF power. The other one of the first operational state (S1) and the second operational state (S2) has to be tuned using the frequency setpoint of the primary RF signal generator 137 to maximize delivered primary RF power. For example, in some embodiments, the first operational state (S1) (high primary power) is tuned to maximize delivered primary RF power using one or more capacitor setting(s) within the impedance matching system 141, and the second operational state (S2) (low primary power) is tuned to maximize delivered primary RF power using the frequency setpoint of the primary RF signal generator 137.

In order to maximize RF power delivery to the plasma in both the first operational state (S1) and the second operational state (S2), the first operating frequency setpoint ($f_{P1S1}$) and the second operating frequency preset setpoint ($f_{P1S2}$) must be set to simultaneously minimize reflected RF power at the output 210 of the primary RF signal generator 137 in both the first operational state (S1) and the second operational state (S2), while also simultaneously minimizing an applied versus setpoint voltage/power difference as measured at the output 210 of the primary RF signal generator 137 in both the first operational state (S1) and the second operational state (S2). Therefore, in the example multi-level RF power pulsing process of FIG. 4, a 2D frequency setpoint grid exists for the primary RF signal generator 137, with first operating frequency setpoint ($f_{P1S1}$) on a horizontal axis of the 2D frequency setpoint grid, and with the second operating frequency preset setpoint ($f_{P1S2}$) on a vertical axis of the 2D frequency setpoint grid. An optimum set of setpoint frequency coordinates $\{F_{P1S1}, F_{P1S2}\}$ exists within the 2D frequency setpoint grid that includes: 1) an optimal value of the first operating frequency setpoint ($\Gamma_{P1S1}$) to be applied during the first operational state (S1), and 2) an optimal value of the second operating frequency preset setpoint ($\Gamma_{P1S2}$) to be applied during the second operational state (S2). In the automated frequency tuning method, the optimal set of setpoint frequency coordinates $\{\Gamma_{P1S1}, \Gamma_{P1S2}\}$ corresponds to a minimum achievable value of a cost function (J), as shown in Equation 2.

$$J(f_{P1S1}, f_{P1S2}) = \frac{|\overline{V_{P1S1}} - V_{P1S1\_setpoint}|}{V_{P1S1\_setpoint}} + \frac{|\overline{V_{P1S2}} - V_{P1S2\_setpoint}|}{V_{P1S2\_setpoint}} + \overline{\Gamma_{P1S1}} + \overline{\Gamma_{P1S2}}. \quad \text{Equation 2}$$

The cost function (J) of Equation 2 considers the quantities of the average reflection coefficient ($\overline{\Gamma_{P1S1}}$) for the first operation state (S1) over a period of time (which indicates reflected RF power), the average reflection coefficient ($\overline{\Gamma_{P1S2}}$) for the second operation state (S2) over the period of time (which indicates reflected RF power), the deviation of the applied (as-measured) voltage/power ($\overline{V_{P1S1}}$) from the setpoint voltage/power ($V_{P1S1\_setpoint}$) for the first operational state (S1) over the period of time, and the deviation of the applied (as-measured) voltage/power ($\overline{V_{P1S2}}$) from the setpoint voltage/power ($V_{B1S2\_setpoint}$) for the second operational state (S2) over the period of time. The term ($|\overline{V_{P1S1}} - V_{P1S1\_setpoint}|/V_{P1S1\_setpoint}$) in the cost function (J) is an average of a relative error in voltage generated by the primary RF signal generator 137 at the wafer plane in the first operational state (S1) over the period of time. The term ($|\overline{V_{P1S2}} - V_{P1S2\_setpoint}|/V_{P1S2\_setpoint}$) in the cost function (J) is an average of a relative error in voltage generated by the bias RF signal generator 125 at the wafer plane in the second operational state (S2) over the period of time. In some embodiments, Equation 2 can be modified to have the average VSWR ($\overline{VSWR_{P1S1}}$) for the first operational state (S1) over the period of time substituted for the average reflection coefficient ($\overline{\Gamma_{P1S1}}$) for the first operation state (S1) over the period of time, and/or to have the average VSWR ($\overline{VSWR_{P1S2}}$) for the second operational state (S2) over the period of time substituted for the average reflection coefficient ($\overline{\Gamma_{P1S2}}$) for the second operation state (S2) over the period of time.

The cost function (J) of Equation 2 can be evaluated at any point on the 2D frequency setpoint grid defined by the first operating frequency setpoint ($f_{P1S1}$) and the second operating frequency preset setpoint ($f_{P1S2}$) by performing a plasma processing recipe step as follows:

Turning the bias RF signal generator 125 off.

Setting the high power/voltage state (e.g., the first operational state (S1) in the example of FIG. 4) for the primary RF signal generator 137 in the Match Cap tuning mode, Setting the low power/voltage state (e.g., the second operational state (S2) in the example of FIG. 4) for the primary RF signal generator 137 in Manual tuning mode, Setting the preset frequency ($F_{P1S1}$) of the first operational state (S1) to the desired value, Setting the preset frequency ($F_{P1S2}$) of the second operational state (S2) to the desired value, Running the plasma processing recipe step for about 5 seconds on a test wafer having a target material film deposited thereon, or until it is possible to measure the following at the output 210 of the primary RF signal generator 137: the average reflection coefficient ($\overline{\Gamma_{P1S1}}$) for the first operational state (S1), the average reflection coefficient ($\overline{\Gamma_{P1S2}}$) for the second operational state (S2), the average voltage/power ($\overline{V_{P1S1}}$) for the first operational state (S1), and the average voltage/power ($\overline{V_{P1S2}}$) for the second operational state (S2), and Computing the cost function (J) as shown in Equation 2 for the set of frequency coordinates $\{F'_{P1S1}, F'_{P1S2}\}$.

The average values of reflection coefficients and the voltage/power for the cost function (J) are obtained from the RF generator data logger by excluding the transient part of the step to obtain the steady state values. The triangulation search algorithm described above with regard to FIGS. 6A through 6E is performed to determine the optimal set of setpoint frequency coordinates $\{F_{P1S1}, F_{P1S2}\}$ within the 2D frequency search grid for the primary RF signal generator 137. The optimal set of setpoint frequency coordinates $\{F_{P1S1}, F_{P1S2}\}$ is the output of the frequency tuning process for the primary RF signal generator 137. After the optimal set of setpoint frequency coordinates $\{F_{P1S1}, F_{P1S2}\}$ is determined for the primary RF signal generator 137, the same automated frequency tuning method described above for determining the optimal set of setpoint frequency coordinates $\{F_{B1S1}, F_{B1S2}\}$ for the bias RF signal generator 125 is performed while using the optimal set of setpoint frequency coordinates $\{F_{P1S1}, F_{P1S2}\}$ to run the primary RF signal generator 137.

Figure 10:
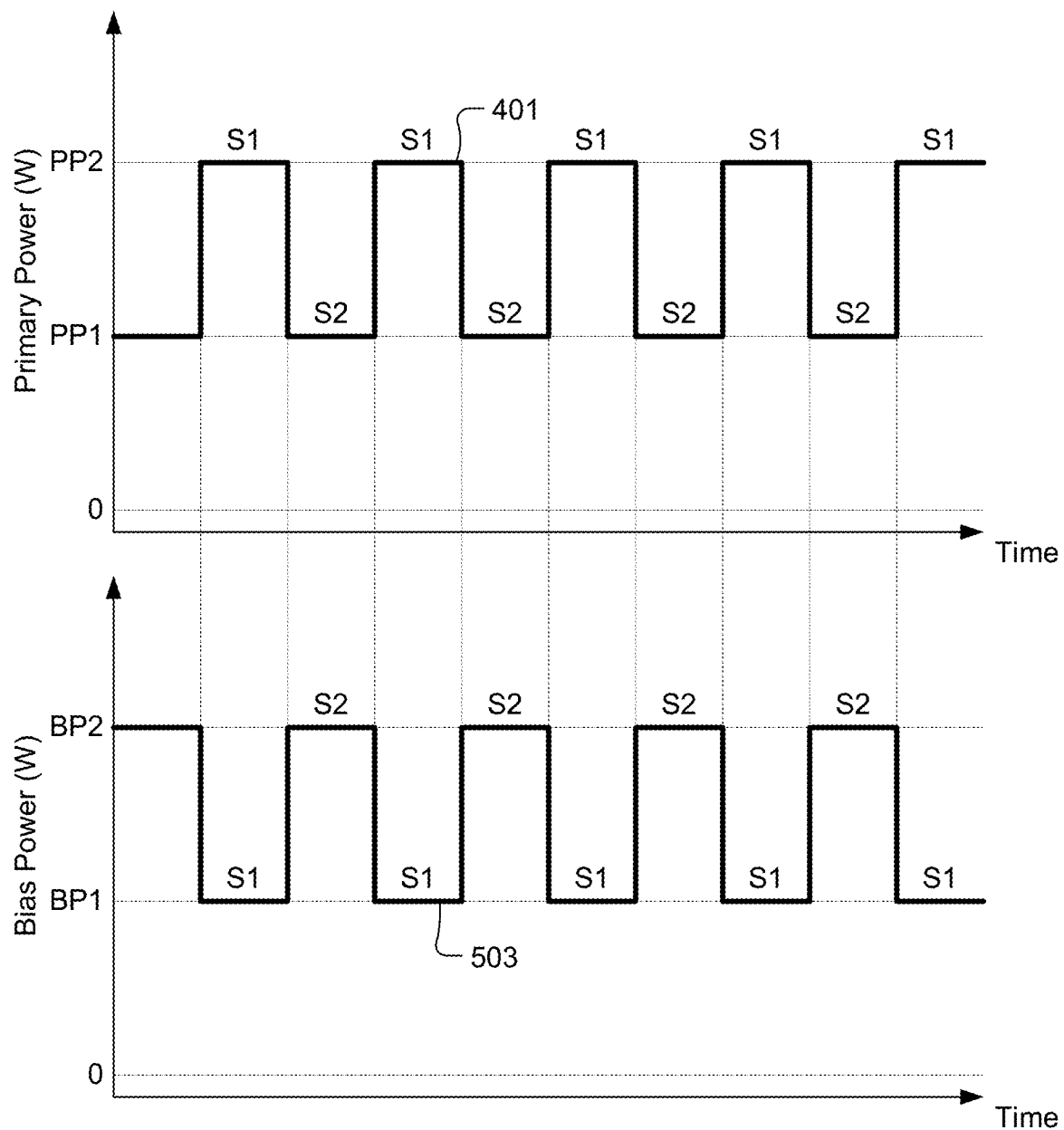
FIG. 10 shows an operational diagram of a multi-level RF power pulsing process in which both the bias RF power and the primary RF power are pulsed in an asynchronous manner, in accordance with some embodiments.

FIG. 10 shows an operational diagram of a multi-level RF power pulsing process in which both the bias RF power and the primary RF power are pulsed in an asynchronous manner, in accordance with some embodiments. The bias RF power is pulsed in an opposite manner as described with regard to FIG. 3. Specifically, the low bias power (BP1) occurs during the first operation state (S1), and the high bias power (BP2) occurs during the second operational state (S2), as indicated by line 503. Also, like the embodiment of FIG. 9, the high primary power (PP2) occurs during the first operational state (S1), and the low primary power (PP1)

occurs during the second operational state (S2). The automated frequency tuning method described above with regard to FIG. 9 is used to determine the optimal set of setpoint frequency coordinates $\{F_{P1S1}, F_{P1S2}\}$ within the 2D frequency search grid for the primary RF signal generator 137. After the optimal set of setpoint frequency coordinates $\{F_{P1S1}, F_{P1S2}\}$ is determined for the primary RF signal generator 137, the same automated frequency tuning method described above with regard to FIG. 3 for determining the optimal set of setpoint frequency coordinates $\{F_{B1S1}, F_{B1S2}\}$ for the bias RF signal generator 125 is performed while using the optimal set of setpoint frequency coordinates $\{F_{P1S1}, F_{P1S2}\}$ to run the primary RF signal generator 137.

Figure 11:
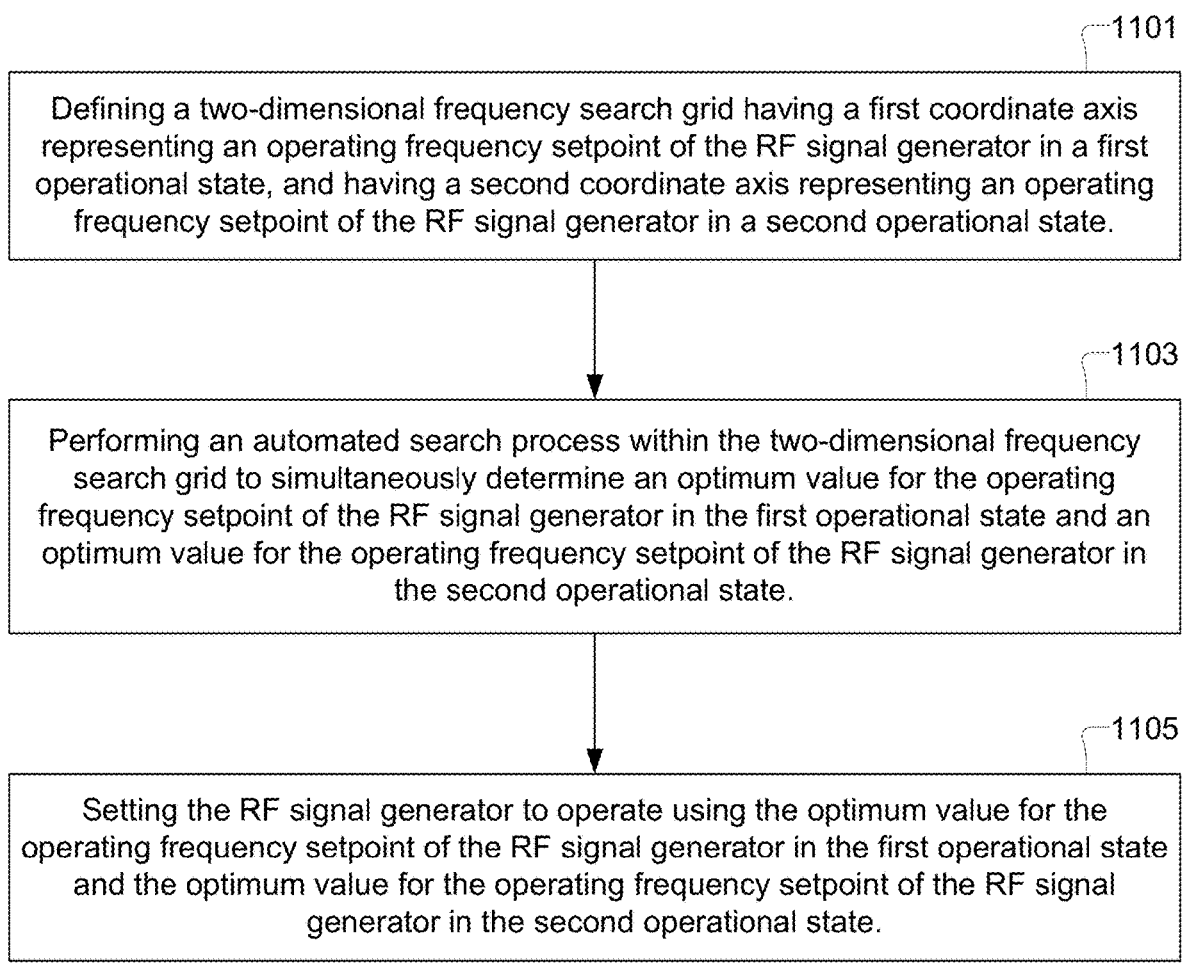
FIG. 11 shows a flowchart of a method for automated frequency tuning of an RF signal generator for operating in a multi-level RF power pulsing mode, in accordance with some embodiments.

FIG. 11 shows a flowchart of a method for automated frequency tuning of an RF signal generator for operating in a multi-level RF power pulsing mode, in accordance with some embodiments. The RF signal generator of FIG. 11 can be either the bias RF signal generator 125 of the primary RF signal generator 137. The method includes an operation 1101 for defining a two-dimensional frequency search grid having a first coordinate axis representing an operating frequency setpoint of the RF signal generator in a first operational state (e.g., $f_{B1S1}$ or $f_{P1S1}$) and having a second coordinate axis representing an operating frequency preset setpoint of the RF signal generator in a second operational state (e.g., $f_{B1S2}$ or $f_{P1S2}$). The RF signal generator has a first output power level in the first operational state and a second output power level in the second operational state. The first and second output power levels are different from each other. The RF signal generator is programmed to operate in the multi-level RF power pulsing mode by cyclically alternating between the first operational state and the second operational state, such as shown in FIGS. 3, 9, and 10. The method also includes an operation 1103 for performing an automated search process within the two-dimensional frequency search grid to simultaneously determine a first optimum value for the operating frequency setpoint of the RF signal generator in the first operational state and a second optimum value for the operating frequency setpoint of the RF signal generator in the second operational state. The method also includes an operation 1105 for setting the RF signal generator to operate using the first optimum value for the operating frequency setpoint of the RF signal generator in the first operational state and the second optimum value for the operating frequency setpoint of the RF signal generator in the second operational state.

In some embodiments, the automated search process is directed by the control system 153 of the plasma processing system 100 that includes the RF signal generator. In some embodiments, the automated search process includes multiple iterations with each iteration including operation the RF signal generator in the multi-level RF power pulsing mode to generate a plasma in the plasma processing system 100 using a different set of operating frequency setpoint coordinates within the two-dimensional frequency search grid. In some embodiments, each iteration of the automated search process includes empirical evaluation of RF power delivery from the RF signal generator to the plasma. In some embodiments, the plasma is generated in exposure to the substrate 107 in each iteration of the automated search process, with the substrate 107 having a film of a target material present on a top surface of the substrate 107 that is exposed to the plasma. In some embodiments, the RF signal generator of the method is the bias RF signal generator 125, with the plasma processing system 100 also including the primary RF signal generator 137 that is separate from the bias RF signal generator 125. In these embodiments, each iteration of the automated search process includes operation of the primary RF signal generator 137 to generate additional plasma in the plasma processing system 100. In some embodiments, the RF signal generator of the method is the primary RF signal generator 137. In some embodiments, the plasma processing system 100 also includes the bias RF signal generator 125 that is separate from the primary RF signal generator 137. In these embodiments, each iteration of the automated search process to automatically frequency tune the primary RF signal generator 137 for operation in the multi-level RF power pulsing mode is performed with the bias RF signal generator 125 turned off.

In some embodiments, the automated search process is a triangulation search process performed within the two-dimensional frequency search grid to determine an optimum set of frequency coordinates (e.g., $\{F_{B1S1}, F_{B1S2}\}$ or $\{F_{P1S1}, F_{P1S2}\}$) within the two-dimensional frequency search grid that correspond to a minimization of the cost function (J) defined to characterize RF power delivery from the RF signal generator to a plasma load. The optimum set of frequency coordinates include the first optimum value for the operating frequency setpoint of the RF signal generator in the first operational state (e.g., $F_{B1S1}$ or $F_{P1S1}$) and the second optimum value for the operating frequency preset setpoint of the RF signal generator in the second operational state (e.g., $F_{B1S2}$ or $F_{p1S2}$). In some embodiments, the triangulation search process includes evaluation of the cost function (J) at vertices of sequentially formed equilateral triangles within the two-dimensional frequency search grid. In some embodiments, the evaluation of the cost function (J) for a given vertex of a given equilateral triangle within the two-dimensional frequency search grid is performed by operating the RF signal generator in the multi-level RF power pulsing mode for a period of time using frequency coordinates (e.g., $\{F'_{B1S1}, F'_{B1S2}\}$ or $\{F'_{P1S1}, F'_{P1S2}\}$) for the given vertex within the two-dimensional frequency search grid as operating frequency setpoints for the RF signal generator in the first and second operational states. In some embodiments, the period of time of operation of the RF signal generator in the multi-level RF power pulsing mode to evaluate the cost function (J) is less than or equal to about 5 seconds. In some embodiments, evaluation of the cost function for the given vertex of the given equilateral triangle within the two-dimensional frequency search grid includes computing a sum of an average of a reflection coefficient for RF signals generated by the RF signal generator in the first operational state over the period of time (e.g., $\overline{\Gamma_{B1S1}}$ or $\overline{\Gamma_{P1S1}}$), and an average of a reflection coefficient for RF signals generated by the RF signal generator in the second operational state over the period of time (e.g., $\overline{\Gamma_{B1S2}}$ or $\overline{\Gamma_{P1S2}}$), and an average of a relative error in voltage generated by the RF signal generator in the first operational state over the period of time (e.g., $|\overline{V_{B1S1}} - V_{B1S1\_setpoint}|/V_{B1S1\_setpoint}$ or $|\overline{V_{P1S1}} - V_{P1S1\_setpoint}|/V_{P1S1\_setpoint}$), and an average of a relative error in voltage generated by the RF signal generator in the second operational state over the period of time (e.g., $|\overline{V_{B1S2}} - V_{B1S2\_setpoint}|/V_{B1S2\_setpoint}$ or $|\overline{V_{P1S2}} - V_{P1S2\_setpoint}|/V_{P1S2\_setpoint}$).

In some embodiments, the triangulation search process further includes a process of sequentially forming equilateral triangles within the two-dimensional frequency search grid by: 1) identifying a particular vertex of a current equilateral triangle that has a largest cost function (J) value among three vertices of the current equilateral triangle, and 2) moving the particular vertex of the current equilateral triangle in a straight line through a centroid of the current equilateral triangle, while maintaining positions of the two other vertices of the current equilateral triangle, until the particular vertex reaches a new vertex position within the two-dimensional frequency search grid corresponding to formation of a new equilateral triangle defined by the new vertex position and the positions of the two other vertices whose positions were maintained. This process is described by way of example with regard to FIGS. 6A through 6E. In some embodiments, the triangulation search process continues the process of sequentially forming equilateral triangles within the two-dimensional frequency search grid until the new equilateral triangle is a repeat of a previous equilateral triangle, at which time the triangulation search process reduces a size of the new equilateral triangle and restarts the process of sequentially forming equilateral triangles within the two-dimensional frequency search grid.

In some embodiments, the triangulation search process continues the process of sequentially forming equilateral triangles within the two-dimensional frequency search grid and reducing the size of the new equilateral triangle when it repeats the previous equilateral triangle until convergence criteria are satisfied. In some embodiments, the convergence criteria of the triangulation search process includes a change of less than or equal to about 5% in the cost function values evaluated for sequential positions of a moving vertex within the two-dimensional frequency search grid, and the new equilateral triangle having a side length of less than or equal to about 5 kiloHertz within the two-dimensional frequency search grid, and a change in position of the moving vertex of less than or equal to about 1 kiloHertz in each frequency coordinate dimension of the two-dimensional frequency search grid.

A system is disclosed herein for automated frequency tuning of an RF signal generator for operating in a multi-level RF power pulsing mode. The system includes the plasma processing chamber 103, which includes the substrate support structure 113 and the electrode 123 and/or 101. The system also includes an RF signal generator configured to generate RF signals and transmit the RF signals through an output of the RF signal generator. The RF signal generator is either the bias RF signal generator 125 of the primary RF signal generator 137. The RF signal generator is set to have a first output power level in a first operational state and a second output power level in a second operational state, where the first and second output power levels are different from each other. The RF signal generator is programmed to operate in the multi-level RF power pulsing mode by cyclically alternating between the first operational state and the second operational state. The system also includes an impedance matching system having an input connected to the output of the RF signal generator. The impedance matching system is the impedance matching system 129 when the RF signal generator is the bias RF signal generator 125. The impedance matching system is the impedance matching system 141 when the RF signal generator is the primary RF signal generator 137. The impedance matching system has an output connected to the electrode 123 or 101. The impedance matching system is configured to control an impedance at the output of the RF signal generator to enable transmission of the RF signals through the electrode 123 or 101 to a plasma generated within the plasma processing chamber 103.

The system also includes the control system 153 programmed to define a two-dimensional frequency search grid having a first coordinate axis representing an operating frequency setpoint of the RF signal generator in the first operational state (e.g., $f_{B1S1}$ or $f_{P1S1}$) and having a second coordinate axis representing an operating frequency preset setpoint of the RF signal generator in the second operational state (e.g., $f_{B1S2}$ or $f_{P1S2}$). The control system 153 is programmed to perform an automated frequency search process within the two-dimensional frequency search grid to simultaneously determine a first optimum value for the operating frequency setpoint of the RF signal generator in the first operational state and a second optimum value for the operating frequency setpoint of the RF signal generator in the second operational state. In some embodiments, the control system 153 is programmed to set the RF signal generator to operate using the first optimum value for the operating frequency setpoint of the RF signal generator in the first operational state and the second optimum value for the operating frequency setpoint of the RF signal generator in the second operational state.

In some embodiments, the automated search process includes multiple iterations, and for each iteration, the control system 153 is programmed to direct operation the RF signal generator in the multi-level RF power pulsing mode to generate a plasma in the plasma processing chamber 103 using a different set of operating frequency setpoint coordinates within the two-dimensional frequency search grid. In some embodiments, the control system 153 is programmed to empirically evaluate RF power delivery from the RF signal generator to the plasma in each iteration of the automated search process. In some embodiments, the substrate 107 is disposed on the substrate support structure 113, with the substrate 107 having a film of a target material present on a top surface of the substrate 107 that is exposed to the plasma generation region 106 within the plasma processing chamber 103. In some embodiments, the plasma is generated in exposure to the substrate 107 in each iteration of the automated search process.

In some embodiments, the RF signal generator of the system is the bias RF signal generator 125. In these embodiments, the system further includes the primary RF signal generator 137 that is separate from the bias RF signal generator 125. In these embodiments, the control system 153 is programmed to direct operation of the primary RF signal generator 137 to generate additional plasma in the plasma processing chamber 103 during each iteration of the automated search process. In some embodiments, the RF signal generator of the system is the primary RF signal generator 137. In some of these embodiments, the system also includes the bias RF signal generator 125 separate from the primary RF signal generator 137. In these embodiments, the control system 153 is programmed to turn off the bias RF signal generator 125 during each iteration of the automated search process to automatically frequency tune the primary RF signal generator 137 for operation in the multi-level RF power pulsing mode.

In some embodiments, the control system 153 is programmed to perform the automated search process as a triangulation search process within the two-dimensional frequency search grid to determine the optimum set of frequency coordinates (e.g., $\{F_{B1S1}, F_{B1S2}\}$ or $\{F_{P1S1}, F_{P1S2}\}$) within the two-dimensional frequency search grid that correspond to a minimization of the cost function (J) defined to characterize RF power delivery from the RF signal generator to the plasma. The optimum set of frequency coordinates include the first optimum value for the operating frequency setpoint of the RF signal generator in the first operational state (e.g., $F_{B1S1}$ or $F_{p1S1}$) and the second optimum value for the operating frequency preset setpoint of the RF signal generator in the second operational state (e.g., $F_{B1S2}$ or $F_{P1S2}$). In some embodiments, the control system 153 is programmed to perform the triangulation search process by evaluating the cost function (J) at vertices of sequentially formed equilateral triangles within the two-dimensional frequency search grid.

In some embodiments, the control system 153 is programmed to evaluate the cost function (J) for a given vertex of a given equilateral triangle within the two-dimensional frequency search grid by directing operation of the RF signal generator in the multi-level RF power pulsing mode for a period of time using frequency coordinates (e.g., {F'$_{B1S1}$, F'$_{B1S2}$} or {F'$_{P1S1}$, F'$_{P1S2}$}) for the given vertex within the two-dimensional frequency search grid as operating frequency setpoints for the RF signal generator in the first and second operational states. In some embodiments, the control system 153 is programmed to set the period of time of operation of the RF signal generator in the multi-level RF power pulsing mode to evaluate the cost function (J) at less than or equal to about 5 seconds. In some embodiments, the control system 153 is programmed to evaluate the cost function (J) for the given vertex of the given equilateral triangle within the two-dimensional frequency search grid by computing a sum of an average of the reflection coefficient for RF signals generated by the RF signal generator in the first operational state over the period of time (e.g., $\overline{\Gamma_{B1S1}}$ or $\overline{\Gamma_{P1S1}}$), and the average of a reflection coefficient for RF signals generated by the RF signal generator in the second operational state over the period of time (e.g., $\overline{\Gamma_{B1S2}}$ or $\overline{\Gamma_{P1S2}}$), and the average of the relative error in voltage generated by the RF signal generator in the first operational state over the period of time (e.g., $|\overline{V_{B1S1}} - V_{B1S1\_setpoint}|/V_{B1S1\_setpoint}$ or $|\overline{V_{P1S1}} - V_{P1S1\_setpoint}|/V_{P1S1\_setpoint}$), and the average of a relative error in voltage generated by the RF signal generator in the second operational state over the period of time (e.g., $|\overline{V_{B1S2}} - V_{B1S2\_setpoint}|/V_{B1S2\_setpoint}$ or $|\overline{V_{P1S2}} - V_{P1S2\_setpoint}|/V_{P1S2\_setpoint}$).

In some embodiments, as part of the triangulation search process, the control system 153 is programmed to perform a process of sequentially forming equilateral triangles within the two-dimensional frequency search grid by: 1) identifying a particular vertex of a current equilateral triangle that has a largest cost function value among three vertices of the current equilateral triangle, and 2) moving the particular vertex of the current equilateral triangle in a straight line through a centroid of the current equilateral triangle while maintaining positions of the two other vertices of the current equilateral triangle until the particular vertex reaches a new vertex position within the two-dimensional frequency search grid corresponding to formation of a new equilateral triangle defined by the new vertex position and the positions of the two other vertices whose positions were maintained. This process is described by way of example with regard to FIGS. 6A through 6E. In some embodiments, as part of the triangulation search process, the control system 153 is programmed to continue the process of sequentially forming equilateral triangles within the two-dimensional frequency search grid until the new equilateral triangle is a repeat of a previous equilateral triangle, at which time the control system 153 is programmed to reduce a size of the new equilateral triangle and restart the process of sequentially forming equilateral triangles within the two-dimensional frequency search grid.

In some embodiments, as part of the triangulation search process, the control system 153 is programmed to continue the process of sequentially forming equilateral triangles within the two-dimensional frequency search grid and reducing the size of the new equilateral triangle when it repeats the previous equilateral triangle until convergence criteria are satisfied. In some embodiments, the control system 153 is programmed to apply convergence criteria that includes a change of less than or equal to about 5% in the cost function values evaluated for sequential positions of a moving vertex within the two-dimensional frequency search grid, and the new equilateral triangle having a side length of less than or equal to about 5 kiloHertz within the two-dimensional frequency search grid, and a change in position of the moving vertex of less than or equal to about 1 kiloHertz in each frequency coordinate dimension of the two-dimensional frequency search grid.

In some embodiments, the automated frequency tuning method disclosed herein for tuning multi-level RF power pulsing recipe steps for optimal RF stability and performance is implemented as a software module built into a recipe editor of the control module 153. In these embodiments, the automated frequency tuning method is implemented as computer program instructions stored within a computer memory within the control module 153. The software module would prompt the user to select the tuner (if desired), and it would automatically tune each multi-level RF power pulsing step of the fabrication process. This procedure would require the user to place the wafer of choice in the plasma processing system 100. Once the plasma processing system 100 has completed the automated frequency tuning method, the operator would be prompted and asked to accept the optimal set of setpoint frequency coordinates {F$_{B1S1}$, F$_{B1S2}$} output by the automated frequency tuning method.

It should be appreciated that the automated frequency tuning method disclosed herein provides a frequency tuning procedure for recipe creation and development that eliminates the need to involve an RF specialist/engineer to manually recommend stable operating frequency conditions. In other words, if a process engineer is developing/creating a recipe with seemingly unstable conditions, the automated frequency tuner disclosed herein can provide a stable operating point for process development to proceed. Also, use of the automated frequency tuning method disclosed herein can lead to the use of new beneficial processing conditions that may lead to better on-wafer metrics (CD, bow, etc.). Implementation of the automated frequency tuning method does not require hardware changes to the plasms processing system 100, thereby making field back-implementation of the automated frequency tuning method feasible and at low cost. The automated frequency tuning method disclosed herein can be implemented in software with no manufacturing or technical changes required to existing process tools.

As mentioned herein, the manual frequency tuning procedure performed by an RF specialist/engineer can take up to 20 minutes per process step (including frequency scan recipe preparation). It has been demonstrated that the automatic frequency tuning method disclosed herein could take 2 to 2.5 minutes, and eliminate the need for an RF specialist/engineer to be present at the tool. Given the wide range of applicability of the automated frequency tuning method disclosed herein, it can be envisioned that the automated frequency tuning method can provide a basis for application of automated frequency tuning to other semiconductor fabrication process tools, especially tools that use level-to-level pulsing.

It should be understood that the embodiments described herein can employ various computer-implemented operations involving data stored in computer systems. These operations are those requiring physical manipulation of physical quantities. Any of the operations described herein that form part of the embodiments are useful machine operations.

The embodiments also relate to a hardware unit or an apparatus for performing these operations. The apparatus may be specially constructed for a special purpose computer. When defined as a special purpose computer, the computer can also perform other processing, program execution or routines that are not part of the special purpose, while still being capable of operating for the special purpose. In some embodiments, the operations may be processed by a general purpose computer selectively activated or configured by one or more computer programs stored in the computer memory, cache, or obtained over a network. When data is obtained over a network, the data may be processed by other computers on the network, e.g., a cloud of computing resources.

Various embodiments described herein can be fabricated as computer-readable code on a non-transitory computer-readable medium. The non-transitory computer-readable medium is any data storage hardware unit that can store data, which can be thereafter be read by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), magnetic tapes, and other optical and non-optical data storage hardware units. The non-transitory computer-readable medium can include computer-readable tangible medium distributed over a network-coupled computer system so that the computer-readable code is stored and executed in a distributed fashion.

Although the foregoing disclosure includes some detail for purposes of clarity of understanding, it will be apparent that certain changes and modifications can be practiced within the scope of the appended claims. For example, it should be understood that one or more features from any embodiment disclosed herein may be combined with one or more features of any other embodiment disclosed herein. Accordingly, the present embodiments are to be considered as illustrative and not restrictive, and what is claimed is not to be limited to the details given herein, but may be modified within the scope and equivalents of the described embodiments.

What is claimed is:

1. A method for automated frequency tuning of a radiofrequency (RF) signal generator for operating in a multi-level RF power pulsing mode, comprising:
defining a two-dimensional frequency search grid having a first coordinate axis representing an operating frequency setpoint of the RF signal generator in a first operational state and having a second coordinate axis representing an operating frequency setpoint of the RF signal generator in a second operational state, the RF signal generator having a first output power level in the first operational state and a second output power level in the second operational state, the first and second output power levels being different from each other, the RF signal generator programmed to operate in the multi-level RF power pulsing mode by cyclically alternating between the first operational state and the second operational state;
performing an automated search process within the two-dimensional frequency search grid to simultaneously determine a first optimum value for the operating frequency setpoint of the RF signal generator in the first operational state and a second optimum value for the operating frequency setpoint of the RF signal generator in the second operational state, wherein the automated search process is a triangulation search process performed within the two-dimensional frequency search grid to determine an optimum set of frequency coordinates within the two-dimensional frequency search grid that correspond to a minimization of a cost function defined to characterize RF power delivery from the RF signal generator to a plasma load, the optimum set of frequency coordinates including the first optimum value and the second optimum value; and
setting the RF signal generator to operate using the first optimum value and the second optimum value.

2. The method as recited in claim 1, wherein the automated search process is directed by a control system of a plasma processing system that includes the RF signal generator.

3. The method as recited in claim 2, wherein the automated search process includes multiple iterations with each iteration including operation the RF signal generator in the multi-level RF power pulsing mode to generate a plasma in the plasma processing system using a different set of operating frequency setpoint coordinates within the two-dimensional frequency search grid.

4. The method as recited in claim 3, wherein each iteration includes empirical evaluation of RF power delivery from the RF signal generator to the plasma.

5. The method as recited in claim 3, wherein the plasma is generated in exposure to a substrate in each iteration, the substrate having a film of a target material present on a top surface of the substrate that is exposed to the plasma.

6. The method as recited in claim 3, wherein the RF signal generator is a bias RF signal generator, and wherein the plasma processing system includes a primary RF signal generator that is separate from the bias RF signal generator, and wherein each iteration includes operation of the primary RF signal generator to generate additional plasma in the plasma processing system.

7. The method as recited in claim 3, wherein the RF signal generator is a primary RF signal generator.

8. The method as recited in claim 7, wherein the plasma processing system includes a bias RF signal generator that is separate from the primary RF signal generator, and wherein each iteration is performed with the bias RF signal generator turned off.

9. The method as recited in claim 1, wherein the triangulation search process includes evaluation of the cost function at vertices of sequentially formed equilateral triangles within the two-dimensional frequency search grid.

10. The method as recited in claim 9, wherein evaluation of the cost function for a given vertex of a given equilateral triangle within the two-dimensional frequency search grid is performed by operating the RF signal generator in the multi-level RF power pulsing mode for a period of time using frequency coordinates for the given vertex within the two-dimensional frequency search grid as operating frequency setpoints for the RF signal generator in the first and second operational states.

11. The method as recited in claim 10, wherein the period of time is less than or equal to about 5 seconds.

12. The method as recited in claim 10, wherein evaluation of the cost function for the given vertex of the given equilateral triangle within the two-dimensional frequency search grid includes computing a sum of an average of a reflection coefficient for RF signals generated by the RF signal generator in the first operational state over the period of time, and an average of a reflection coefficient for RF signals generated by the RF signal generator in the second operational state over the period of time, and an average of a relative error in voltage generated by the RF signal generator in the first operational state over the period of time, and an average of a relative error in voltage generated by the RF signal generator in the second operational state over the period of time.

13. The method as recited in claim 12, wherein the triangulation search process further includes a process of sequentially forming equilateral triangles within the two-dimensional frequency search grid by identifying a particular vertex of a current equilateral triangle that has a largest cost function value among three vertices of the current equilateral triangle, and by moving the particular vertex of the current equilateral triangle in a straight line through a centroid of the current equilateral triangle while maintaining positions of the two other vertices of the current equilateral triangle until the particular vertex reaches a new vertex position within the two-dimensional frequency search grid corresponding to formation of a new equilateral triangle defined by the new vertex position and the positions of the two other vertices whose positions were maintained.

14. The method as recited in claim 13, wherein the triangulation search process continues the process of sequentially forming equilateral triangles within the two-dimensional frequency search grid until the new equilateral triangle is a repeat of a previous equilateral triangle, at which time the triangulation search process reduces a size of the new equilateral triangle and restarts the process of sequentially forming equilateral triangles within the two-dimensional frequency search grid.

15. The method as recited in claim 14, wherein the triangulation search process continues the process of sequentially forming equilateral triangles within the two-dimensional frequency search grid and reducing the size of the new equilateral triangle when it repeats the previous equilateral triangle until convergence criteria are satisfied.

16. The method as recited in claim 15, wherein the convergence criteria includes a change of less than or equal to about 5% in the cost function values evaluated for sequential positions of a moving vertex within the two-dimensional frequency search grid, and wherein the convergence criteria includes the new equilateral triangle having a side length of less than or equal to about 5 kiloHertz within the two-dimensional frequency search grid, and wherein the convergence criteria includes a change in position of the moving vertex of less than or equal to about 1 kiloHertz in each frequency coordinate dimension of the two-dimensional frequency search grid.

17. A system for automated frequency tuning of a radiofrequency (RF) signal generator for operating in a multi-level RF power pulsing mode, comprising:
a plasma processing chamber including a substrate support structure and an electrode;
an RF signal generator configured to generate RF signals and transmit the RF signals through an output of the RF signal generator, the RF signal generator set to have a first output power level in a first operational state and a second output power level in a second operational state, the first and second output power levels being different from each other, the RF signal generator programmed to operate in the multi-level RF power pulsing mode by cyclically alternating between the first operational state and the second operational state;
an impedance matching system having an input connected to the output of the RF signal generator, the impedance matching system having an output connected to the electrode, the impedance matching system configured to control an impedance at the output of the RF signal generator to enable transmission of the RF signals through the electrode to a plasma generated within the plasma processing chamber; and
a control system programmed to define a two-dimensional frequency search grid having a first coordinate axis representing an operating frequency setpoint of the RF signal generator in the first operational state and having a second coordinate axis representing an operating frequency setpoint of the RF signal generator in the second operational state, the control system programmed to perform an automated search process within the two-dimensional frequency search grid to simultaneously determine a first optimum value for the operating frequency setpoint of the RF signal generator in the first operational state and a second optimum value for the operating frequency setpoint of the RF signal generator in the second operational state, wherein the automated search process is a triangulation search process performed within the two-dimensional frequency search grid to determine an optimum set of frequency coordinates within the two-dimensional frequency search grid that correspond to a minimization of a cost function defined to characterize RF power delivery from the RF signal generator to a plasma load, the optimum set of frequency coordinates including the first optimum value and the second optimum value.

18. The system as recited in claim 17, wherein the control system is programmed to set the RF signal generator to operate using the first optimum value and the second optimum value.

19. The system as recited in claim 17, wherein the automated search process includes multiple iterations, wherein for each iteration the control system is programmed to direct operation the RF signal generator in the multi-level RF power pulsing mode to generate a plasma in the plasma processing chamber using a different set of operating frequency setpoint coordinates within the two-dimensional frequency search grid.

* * * * *